(12) United States Patent
Oka et al.

(10) Patent No.: US 8,221,942 B2
(45) Date of Patent: Jul. 17, 2012

(54) PATTERN CORRECTION METHOD, EXPOSURE MASK, MANUFACTURING METHOD OF EXPOSURE MASK, AND MANUFACTURING METHOD OF SEMICONDUCTOR DEVICE

(75) Inventors: Mikio Oka, Kanagawa (JP); Kaoru Koike, Kumamoto (JP); Kensuke Tsuchiya, Kanagawa (JP); Hidetoshi Ohnuma, Kanagawa (JP)

(73) Assignee: Sony Corporation, Tokyo (JP)

( * ) Notice: Subject to any disclaimer, the term of this patent is extended or adjusted under 35 U.S.C. 154(b) by 209 days.

(21) Appl. No.: 12/688,039

(22) Filed: Jan. 15, 2010

(65) Prior Publication Data
US 2010/0183960 A1    Jul. 22, 2010

(30) Foreign Application Priority Data
Jan. 22, 2009   (JP) .................... 2009-011689

(51) Int. Cl.
*G03F 1/76* (2012.01)
*G03F 5/00* (2006.01)

(52) U.S. Cl. .......................... 430/5; 430/311

(58) Field of Classification Search .............. 430/5, 311, 430/312, 313; 716/52, 53, 55
See application file for complete search history.

(56) References Cited

U.S. PATENT DOCUMENTS

| 7,249,342 B2* | 7/2007 | Pack et al. ............ 716/52 |
| 2005/0216877 A1* | 9/2005 | Pack et al. ............ 716/19 |

FOREIGN PATENT DOCUMENTS

| JP | 08-241929 | 9/1996 |
| JP | 2001-028401 | 1/2001 |

* cited by examiner

*Primary Examiner* — Stephen Rosasco
(74) *Attorney, Agent, or Firm* — SNR Denton US LLP

(57) ABSTRACT

A pattern correction method includes: a correction step of performing pattern correction on a semiconductor circuit pattern having plural transistors as component elements; an order of priority recognition step of recognizing an order of priority set with respect to the plural transistors prior to the pattern correction at the correction step; and a condition adjustment step of adjusting correction conditions for the pattern correction with reference to the transistor having a high priority recognized at the order of priority recognition step in the pattern correction at the correction step.

16 Claims, 17 Drawing Sheets

| | TRANSISTOR PERFORMANCE RELATIONSHIP FOR STABLE OPERATION |
|---|---|
| DATA RETENTION | DRIVE TRANSISTOR > TRANSFER TRANSISTOR |
| DATA READOUT | TRANSFER TRANSISTOR >> LOAD DEVICE |
| DATA WRITING | TRANSFER TRANSISTOR |

※ BROKEN LINES: BEFORE CHANGE, SOLID LINES: AFTER CHANGE

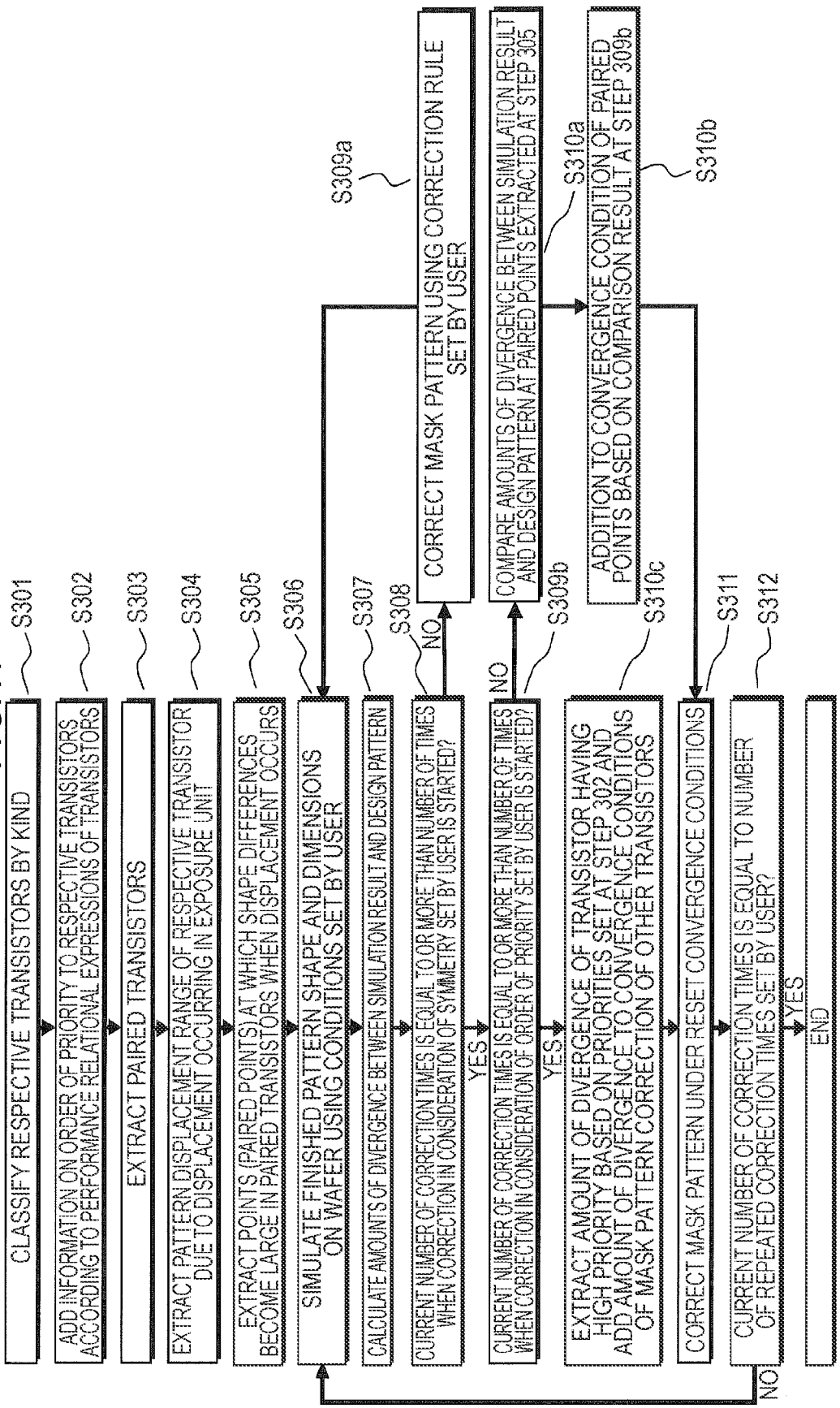

PATTERN CORRECTION METHOD, EXPOSURE MASK, MANUFACTURING METHOD OF EXPOSURE MASK, AND MANUFACTURING METHOD OF SEMICONDUCTOR DEVICE

BACKGROUND OF THE INVENTION

1. Field of the Invention

The present invention relates to a pattern correction method, an exposure mask, a manufacturing method of an exposure mask, and a manufacturing method of a semiconductor device.

2. Description of Related Art

Generally, a semiconductor integrated circuit device has plural transistors as component elements. For example, in a memory cell of an SRAM (Static Random Access Memory), many field-effect transistors forming pairs (hereinafter, a pair of transistors is also referred to as "paired transistors") on the circuit are used. More specifically, a one-port SRAM cell having a CMOS (Complementary Metal Oxide Semiconductor) configuration has three kinds of paired transistors having different functions such as drive transistors, transfer transistors, and load devices.

In the case where plural transistors are provided as component elements, it is considered that there may be characteristic differences among paired transistors due to occurrence of pattern displacement, pattern distortion, or the like in a semiconductor manufacturing process, for example. Such characteristic differences should be prevented because there is a possibility that the flip-flops may become imbalanced and it may be difficult to secure the stability of cell operation. On this account, regarding a semiconductor integrated circuit device, it has been proposed that a diffusion layer forming the transistor is formed in a simple rectangular shape for reduction of influence of displacement or the like (e.g., see JP-A-2001-28401). Further, it has been also proposed that, even when displacement occurs, the pattern shape is changed so that the shapes of paired transistors may be the same (e.g., see JP-A-8-241929).

SUMMARY OF THE INVENTION

However, recently, reduction of memory cell sizes, miniaturization of patterns, and the like have been advanced in semiconductor integrated circuit devices, and it has been becoming difficult to faithfully form design patterns in the respective processes on a wafer. Accordingly, if the design pattern is laid out in consideration of displacement and the like as in the above described related art, it may be impossible to optimize the characteristics in the respective plural transistors due to the differences between the design patterns and transferred image shapes on the wafer because of the process limitation.

Thus, there is need for a pattern correction method, an exposure mask, a manufacturing method of an exposure mask, and a manufacturing method of a semiconductor device by which, when a semiconductor circuit pattern has plural transistors as component elements, characteristics can be optimized in the respective transistors.

A pattern correction method according to an embodiment of the invention includes: a correction step of performing pattern correction on a semiconductor circuit pattern having plural transistors as component elements; an order of priority recognition step of recognizing an order of priority set with respect to the plural transistors prior to the pattern correction at the correction step; and a condition adjustment step of adjusting correction conditions for the pattern correction with reference to the transistor having a high priority recognized at the order of priority recognition step in the pattern correction at the correction step.

In the pattern correction method having the above described procedure, the correction conditions for the pattern correction are adjusted with reference to the transistor having a high priority. Therefore, for example, in the case where it is desirable to generate differences in the performances of the respective transistors, if the order of priority according to the performances is set, the pattern correction for the semiconductor circuit pattern is performed under the correction conditions that maintain the performance differences. In addition, since the preset order of priority is used as reference, there is no influence by the process limitation or the like in the semiconductor manufacturing process.

Further, a pattern correction method according to another embodiment of the invention includes: a distortion recognition step of recognizing amounts of pattern distortion when a semiconductor circuit pattern having symmetrically arranged a pair of transistors as component elements is exposed and transferred onto a semiconductor substrate; a correction step of performing pattern correction on the semiconductor circuit pattern; and a condition adjustment step of adjusting correction conditions for the pattern correction based on a recognition result at the distortion recognition step so that the amount of pattern distortion with respect to one transistor forming the pair of transistors may be made equal to the amount of pattern distortion with respect to the other transistor forming the pair of transistors in the pattern correction at the correction step.

In the pattern correction method having the above described procedure, the correction conditions for the pattern correction are adjusted so that the amount of pattern distortion with respect to one transistor forming the pair of transistors may be made equal to the amount of pattern distortion with respect to the other transistor forming the pair of transistors. Therefore, for example, even when pattern displacement, pattern distortion, or the like occurs in the semiconductor manufacturing process, the pattern correction for the semiconductor circuit pattern is performed under the correction conditions that provide no characteristic difference between the respective transistors forming the pair of transistors. In addition, since one recognition result of the amount of pattern distortion may be made equal to the other recognition result of the amount of pattern distortion, the adjustment of the correction conditions can reliably be performed by making the amount having the larger alteration room to the amount having the smaller alteration room, for example.

According to the embodiments of the invention, the pattern correction for the semiconductor circuit pattern is performed under the correction conditions that maintain differences according to the order of priority with respect to the respective transistors, or under the correction conditions that provide no characteristic difference between the pair of transistors. Therefore, even in the case where the semiconductor circuit pattern has plural transistors as component elements, optimization of characteristics of the respective transistors can be realized. In addition, if miniaturization of the semiconductor circuit patterns or the like is advanced, optimization of characteristics of the respective transistors can be realized without the influence by the process limitation or the like in the semiconductor manufacturing process.

Thus, if semiconductor devices are manufactured using the embodiments of the invention, semiconductor devices having high operation stability can be manufactured with high yield but without increase in cell areas.

BRIEF DESCRIPTION OF THE DRAWINGS

FIG. 17 is a flowchart showing an example of a procedure of a pattern correction method in a third embodiment of the invention.

DESCRIPTION OF PREFERRED INVENTION

As below, a pattern correction method, an exposure mask, a manufacturing method of an exposure mask, and a manufacturing method of a semiconductor device according to embodiments of the invention will be described according to the drawings.

1. First Embodiment

First, a pattern correction method according to the first embodiment of the invention will be explained.

[Outline of Pattern Correction]

Here, the outline of pattern correction for a semiconductor circuit pattern having plural transistors as component elements will be briefly described.

For example, as the semiconductor circuit pattern, an SRAM memory cell is taken as an example. A one-port SRAM cell having a CMOS configuration has two invertors (flip-flops) and two NMOS (Negative channel Metal Oxide Semiconductor) transistors. Further, as has been already described, the SRAM cell has three kinds of paired transistors having different functions such as drive transistors, transfer transistors, and load devices.

In the SRAM cell, the respective operations of data retention, readout, and writing are performed. Among them, in the operation of data retention, the transfer transistors are turned on. Here, in order to perform stable writing in the SRAM cell, it is desirable to use transfer transistors having large current drive forces. However, contrary, at reading out of data, transfer transistors having small current drive forces are suitable. As just described, a design contradiction generally exists in stability between the writing operation and the readout operation.

For this reason, in circuit pattern design of the SRAM cell, stable operation of the SRAM circuit is realized by providing dimension differences in respective gate lengths, gate widths, and the like between the drive transistors, the transfer transistors, and the load devices and differences in performance of the respective transistors.

In the embodiments described as below, regarding the plural transistors as the component elements of the semiconductor circuit pattern, in consideration of performance differences of the respective transistors pattern correction on the semiconductor circuit pattern is performed. That is, by taking the performance differences of the respective transistors into consideration, the influence by pattern displacement, pattern distortion, and the like that can occur in the semiconductor manufacturing process is eliminated while the characteristics of the respective transistors are optimized.

[Schematic Configuration of Pattern Correction Unit]

Subsequently, regarding a pattern correction unit used for pattern correction of the semiconductor circuit pattern, its schematic configuration will be briefly described.

Figure 1:
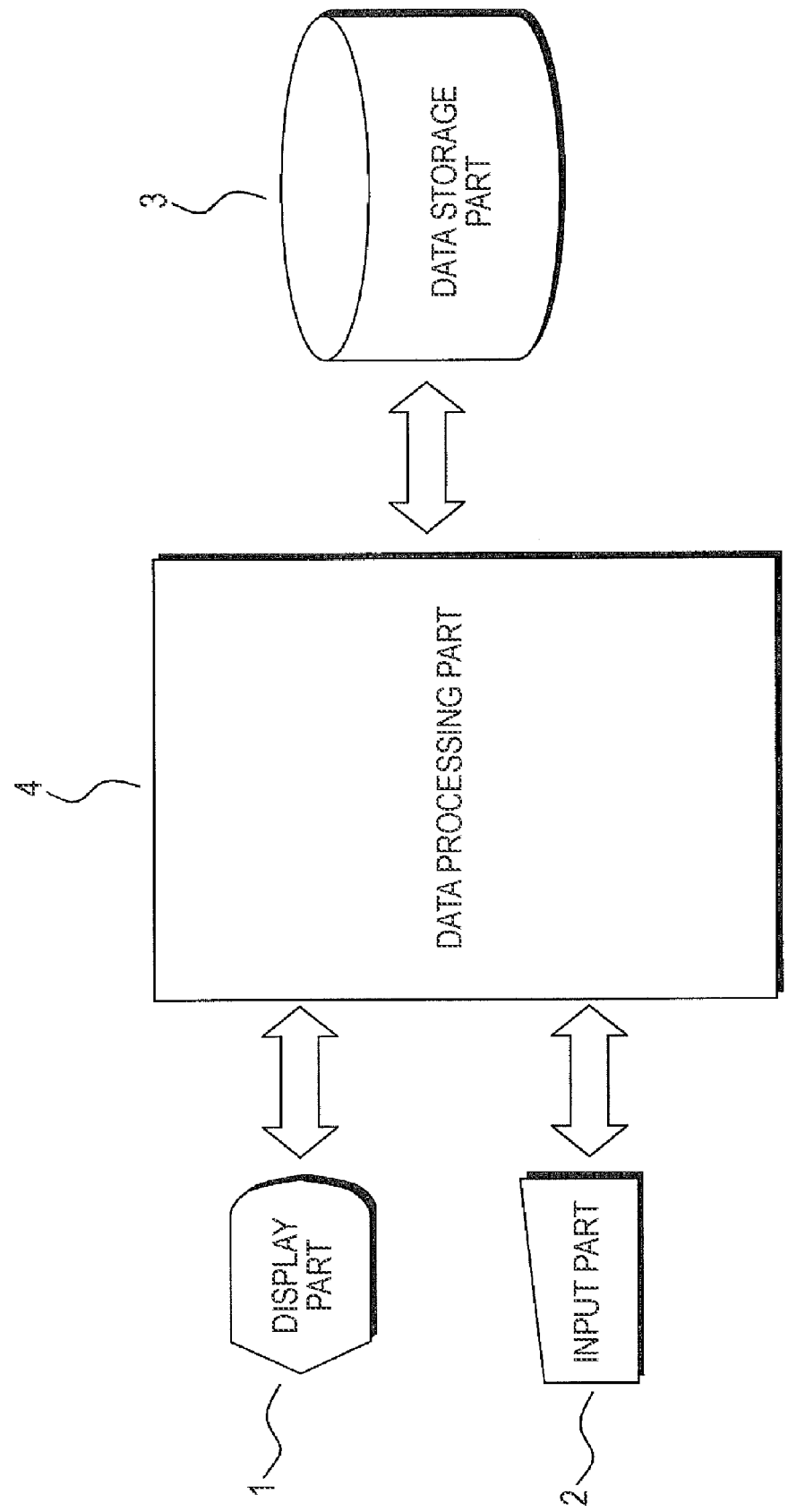
FIG. 1 is a block diagram showing a schematic configuration example of a pattern correction unit that performs pattern correction.

FIG. 1 is a block diagram showing a schematic configuration example of the pattern correction unit that performs pattern correction.

The pattern correction unit of the example in the drawing includes a display part 1 having a display panel or a CRT (Cathode Ray Tube), an input part 2 having a keyboard, a mouse, and the like, a data storage part 3 having a storage device such as an HDD (Hard disk drive), and a data processing part 4 having a function as a computer. Further, the data processing part 4 performs pattern correction on the semiconductor circuit pattern based on the input information from the input part 2 and the stored information in the data storage part 3, and the display part 1 outputs the results.

In the pattern correction unit having the above described configuration, the data processing part 4 has the function as a computer of executing a predetermined program, and thereby, the pattern correction, which will be specifically described later, is performed. In this case, the predetermined program may be stored in a computer-readable recording medium and provided, or delivered via wired or wireless communication means, prior to installation into the data storage part 3.

[Procedure of Pattern Correction]

Next, a procedure of the pattern correction for the semiconductor circuit pattern in the first embodiment will be explained.

Here, as the semiconductor circuit pattern to be pattern-corrected, a circuit pattern of an SRAM memory cell described as below is taken as an example.

Figure 2:
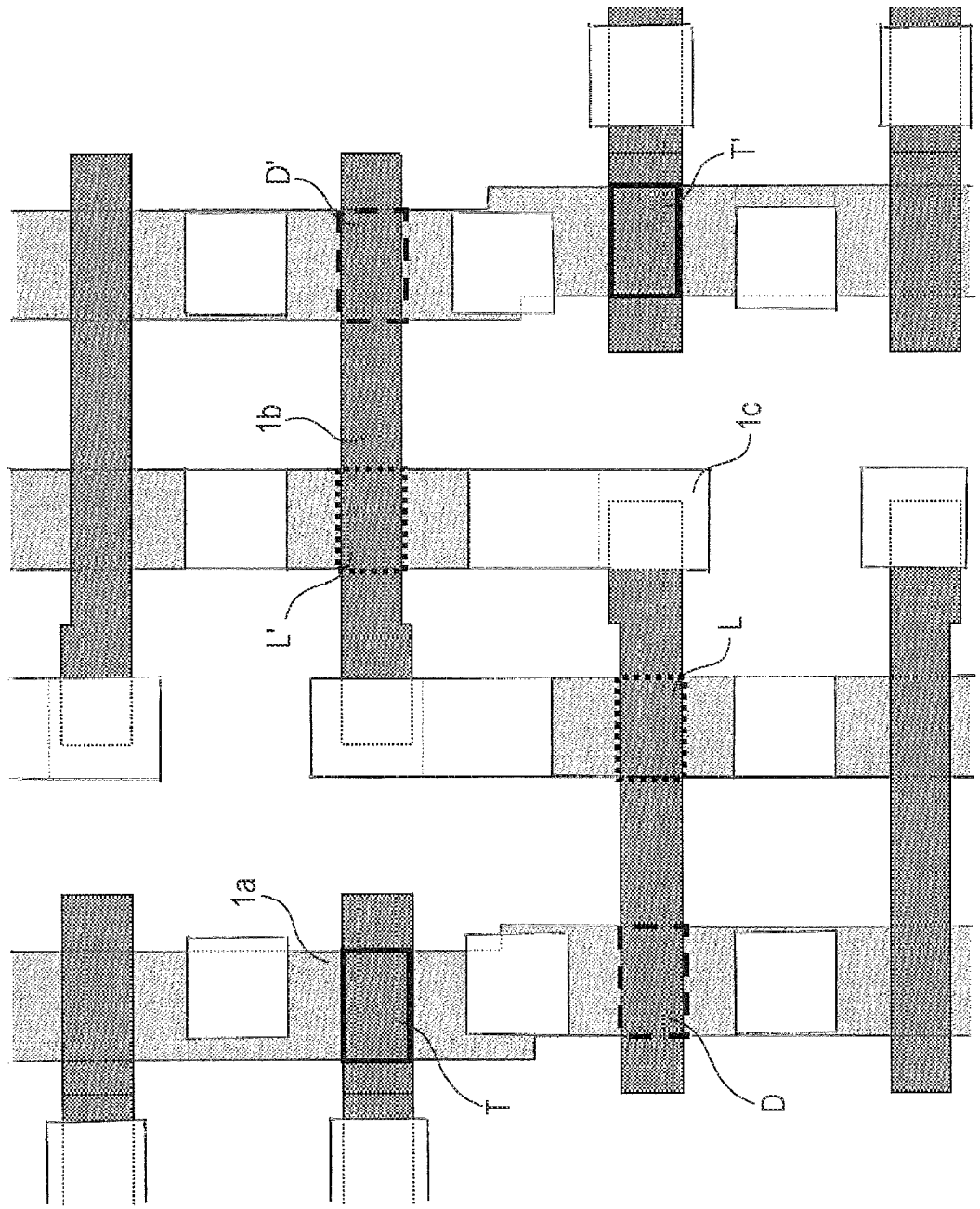
FIG. 2 is a pattern diagram showing a circuit pattern of a one-port SRAM cell having a CMOS configuration as a specific example of a semiconductor circuit pattern.

FIG. 2 is a pattern diagram showing a circuit pattern of a one-port SRAM cell having a CMOS configuration as a specific example of the semiconductor circuit pattern.

The SRAM circuit pattern of the example in the drawing has plural symmetrically arranged pairs of transistors as component elements. More specifically, the pattern uses a diffusion layer pattern 1a, a gate layer pattern 1b, and a contact pattern 1c connecting wiring layers and the diffusion layer pattern and the gate layer pattern, and includes a flip-flop circuit and two NMOS transistors. In the drawing, the areas surrounded by broken lines indicate gate parts of the transistors. As the respective transistors including the gate parts, the pattern has three kinds of paired transistors having different functions such as drive transistors D, D', transfer transistors T, T', and load devices L, L'. The paired transistors D, D', T, T', L, L' are arranged so that the paired ones may be symmetric.

In the first embodiment, pattern correction for such an SRAM circuit pattern is performed in the following procedure.

Figure 3:
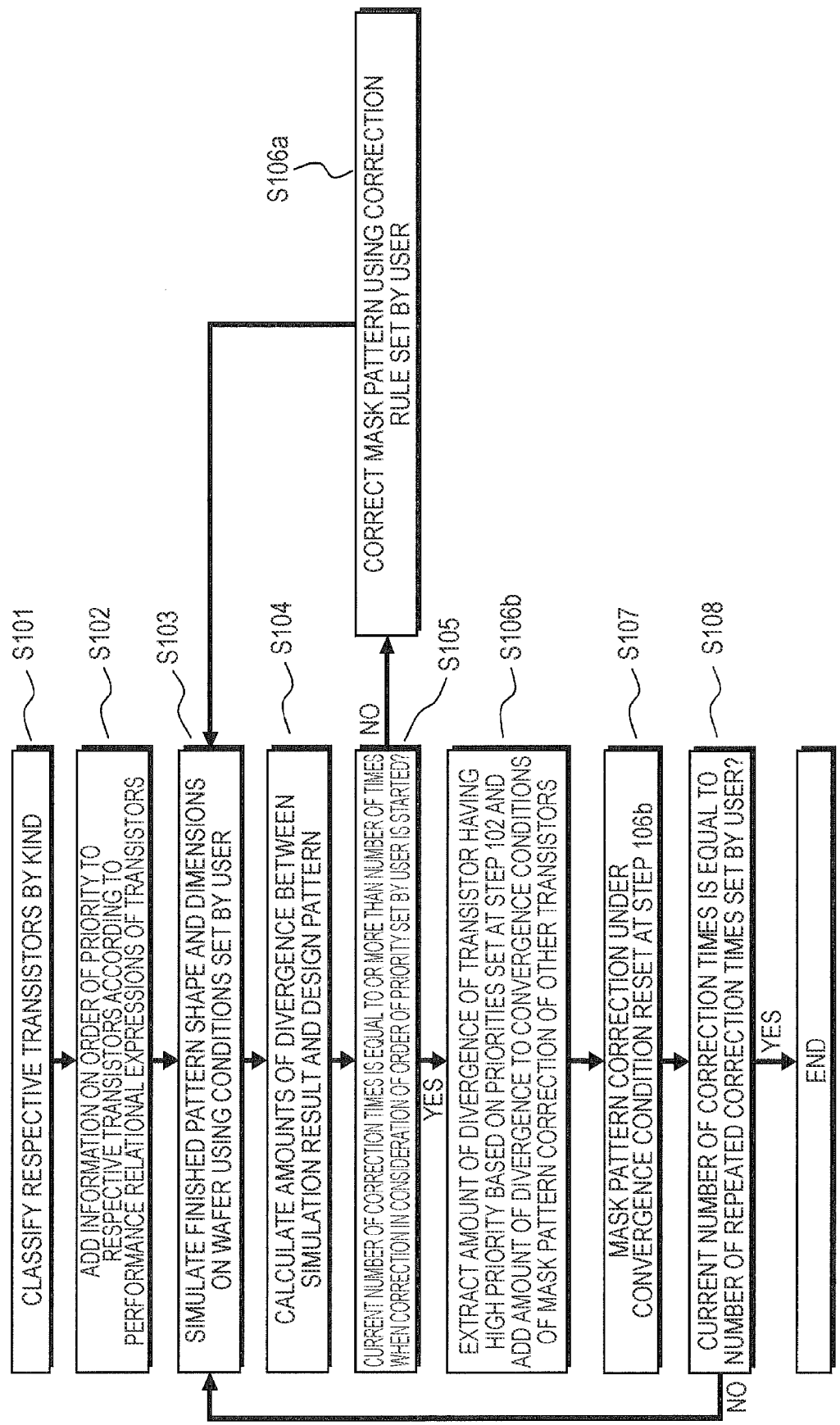
FIG. 3 is a flowchart showing an example of a procedure of a pattern correction method in a first embodiment of the invention.

FIG. 3 is a flowchart showing an example of a procedure of the pattern correction method in the first embodiment of the invention.

In the pattern correction for the SRAM circuit pattern, first, regarding the respective transistors as the component elements of the SRAM circuit pattern, their kinds are classified (Step 101, hereinafter, Step is abbreviated by "S"). That is, which of the drive transistors D, D', the transfer transistors T, T', or the load devices L, L' is classified. It is conceivable that the classification is performed using layout dimensions of the respective transistors (specifically, dimensions specified by design layout information on gate lengths, gate widths, and the like, for example). Or, design intent information (information on priorities provided by a designer to the respective patterns of the layout) may be used for classification.

After the classification of the kinds of transistors, then, the order of priority by kind is recognized with respect to the respective transistors D, D', T, T', L, L' while referring to preset relational expressions of the transistor performances (S102). The relational expressions of the transistor performances specify the performance differences between the transistors for obtaining desired circuit operation and circuit characteristic. Generally, the drive performance of a transistor may be higher as the gate width is larger or the gate length may be smaller. Accordingly, to satisfy the performance relationships between the transistors, the design layout of the drive transistors and transfer transistors is designed so that the gate widths are the same and the gate length of the drive transistors is smaller by about 10 nm, for example, than that of the transfer transistors. The relational expressions of the transistor performances are set for specifying the performance differences.

Figure 4:
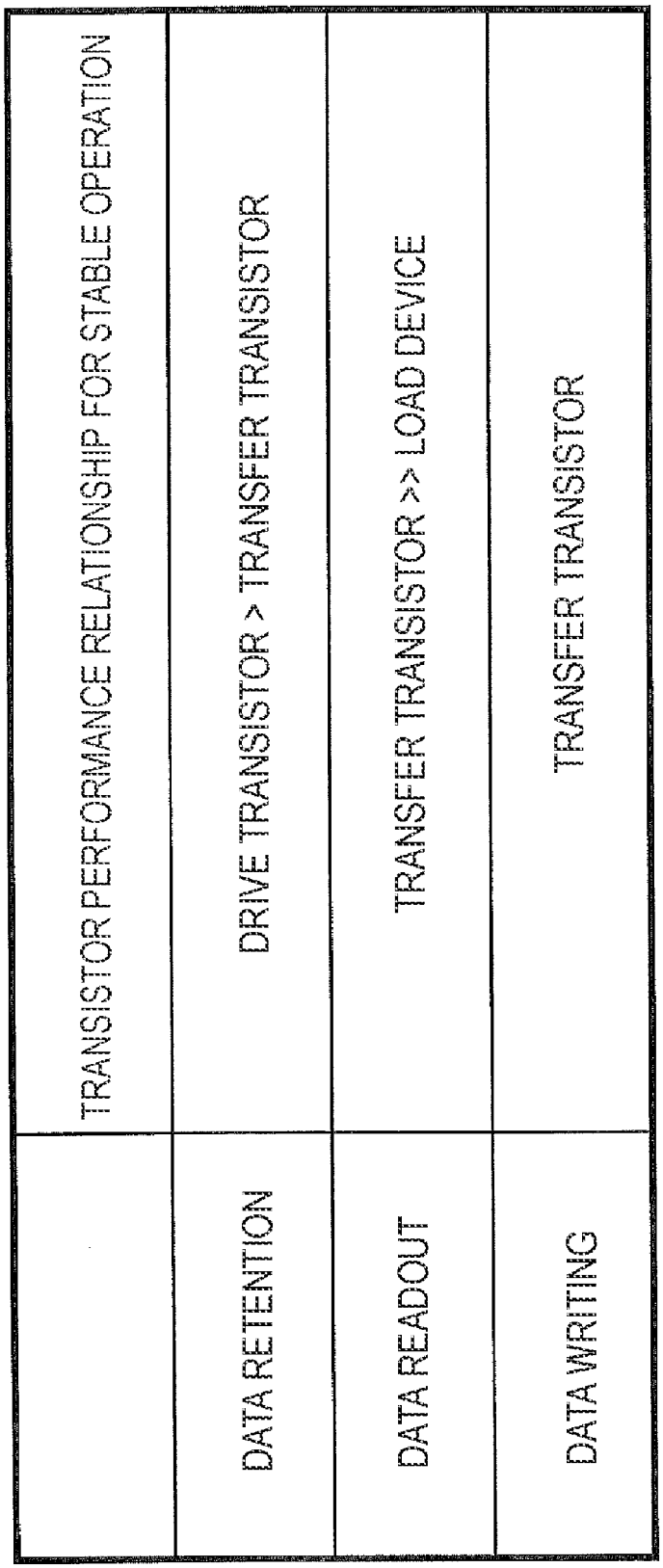
FIG. 4 is an explanatory diagram showing a specific example of relational expressions of transistor performances.

FIG. 4 is an explanatory diagram showing a specific example of relational expressions of transistor performances.

According to the relational expressions of the example in the drawing, the order of priority is given so that the drive transistors D, D' may have the highest importance and the highest priority, the transfer transistors T, T' may be the next highest, and the load devices L, L' may have the lowest importance. The order of priority is given while the memory cell area is shrunk in consideration of the performance differences of the respective transistors necessary for holding the desired characteristics of data retention, data writing, and data readout.

After the order of priority is recognized, regarding the current SRAM circuit pattern, the finished shape, dimensions, and the like of a transferred image obtained by exposure and transfer of the SRAM circuit pattern are calculated (S103). The exposure and transfer are performed using an arbitrary condition set by a user. Further, the calculation of the finished shape, dimensions, and the like is performed by a resist shape simulation, a processed shape simulation, or the like. Note that the calculation may be performed by a simulation in consideration of variations in the dose, focus, or the like in the lithography process.

Then, after the simulation is performed, the simulation result and the design pattern of the SRAM circuit are compared and amounts of divergence between them are extracted (S104).

Figure 5:
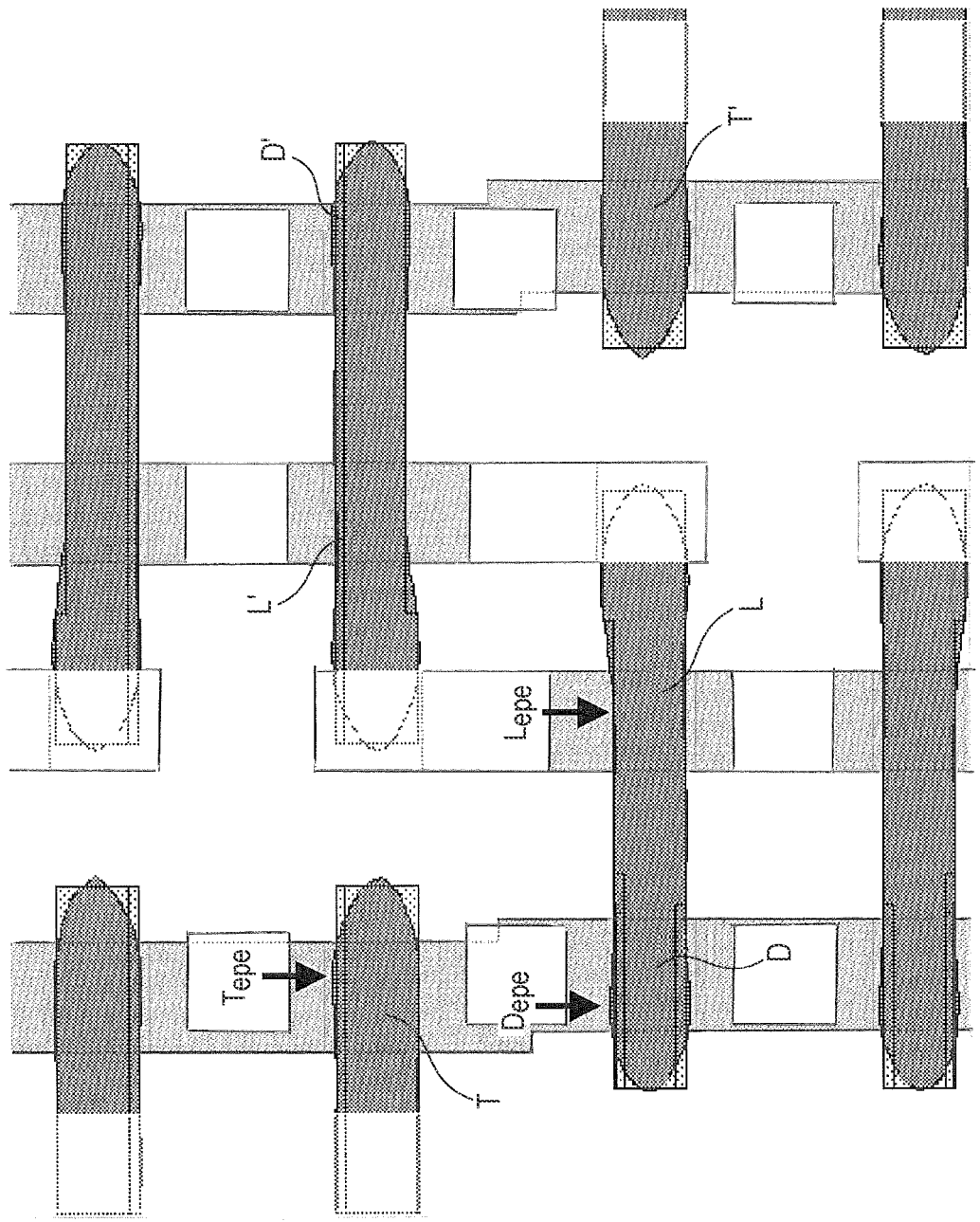
FIG. 5 is a pattern diagram showing a specific example of amounts of divergence between a simulation result and a design pattern.

FIG. 5 is a pattern diagram showing a specific example of the amounts of divergence between the simulation result and the design patterns. In the drawing, Depe, Tepe, Lepe indicate the amounts of divergence between the simulation result and the design patterns of the respective transistors. The respective amounts of divergence (line widths) are Depe=+5 nm/edge, Tepe=+2.5 nm/edge, Lepe=+2 nm/edge, for example.

Then, whether the current number of correction times is equal to or more than the number of times when correction in consideration of the order of priority set by the user is started or not is determined (S105).

At the initial stage of the correction, since the amounts of divergence between the simulation result and the design patterns are large, if OPC (optical proximity correction) in consideration of the order of priority is performed under the condition, the OPC may be diverged. Accordingly, it is desirable that the OPC in consideration of the order of priority is performed after the number of correction times exceeds the number of correction times at which the OPC is converged to some degree. On this account, the above described determination is performed.

Specifically, it is conceivable that the OPC in consideration of the order of priority is started from the number of correction times of seven.

As a result of the determination, if the current number of correction times is less than the times when the correction in consideration of the order of priority set by the user is started, the pattern correction on the SRAM circuit pattern is performed (S106a) based on the correction conditions (rules) set by the user in advance and the amounts of divergence extracted at the above described step (S104). Further, after the pattern correction, the step (S103) of calculating the finished shape, dimensions, and the like of the transferred image is performed.

On the other hand, if the current number of correction times is equal to or more than the times when the correction in consideration of the order of priority set by the user is started, the correction conditions for the pattern correction are adjusted based on the order of priority recognized at the above described step (S102) with reference to the transistor having the highest priority. Specifically, with reference to the amount of divergence of the transistor having the highest priority, the amount of divergence of the transistor having the highest priority is added to the convergence conditions of the pattern correction of the other transistors (S106b).

Figure 6:
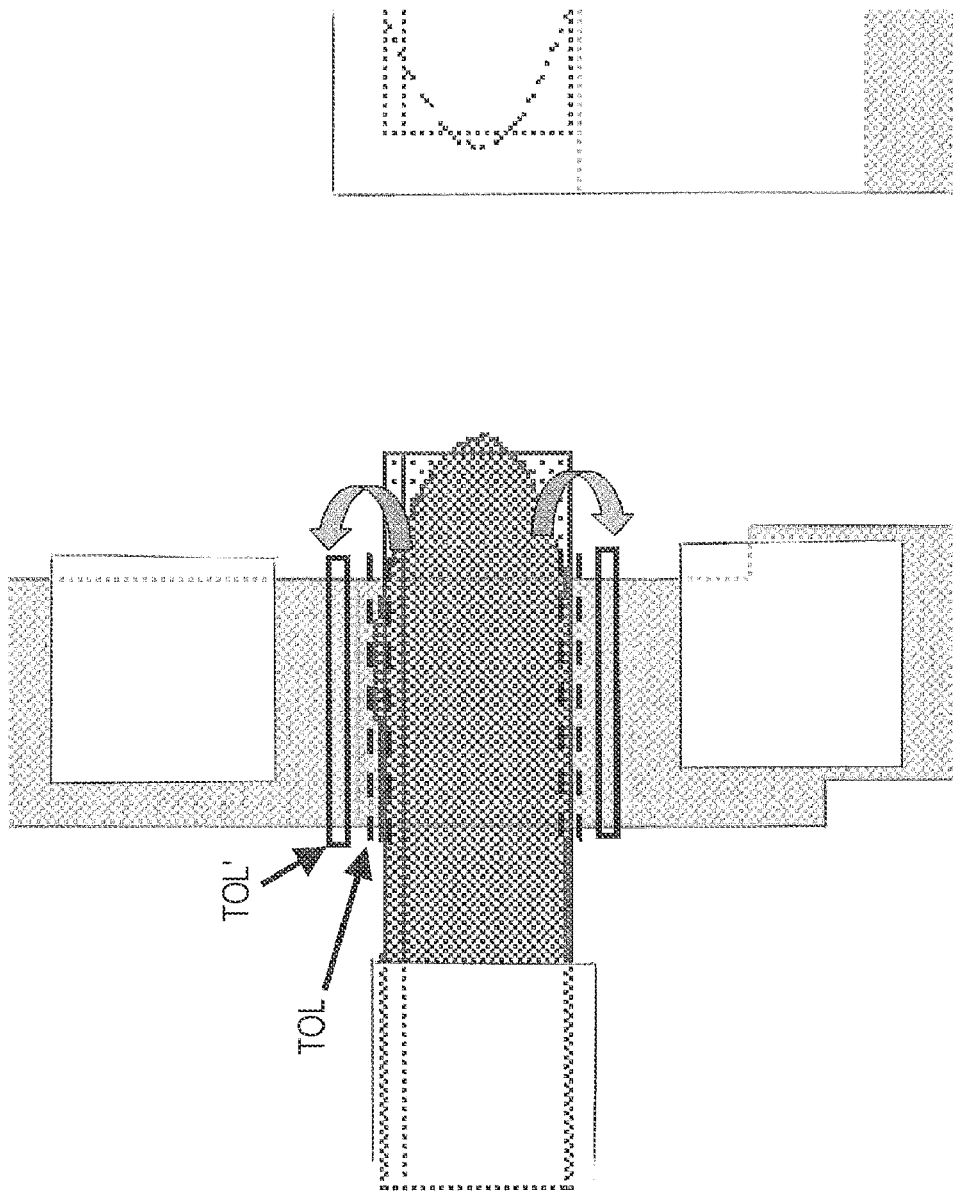
FIG. 6 is a pattern diagram showing a specific example of correction condition adjustment.

FIG. 6 is a pattern diagram showing a specific example of correction condition adjustment.

In the example in the drawing, the case where the convergence conditions TOL of the pattern correction is set to ±1 nm/edge for the design pattern is considered. In this case, if the amount of divergence of the drive transistors D, D' is +5 nm/edge, the convergence conditions TOL' of the other transistors T, T', L, L' become +6 nm/edge to +4 nm/edge by the addition of the amount of divergence.

Then, pattern correction for the SRAM circuit pattern is performed (S107) based on the OPC convergence conditions reset at the above described step (S106b). In this regard, as described above, if the convergence conditions TOL' for other than the drive transistors D, D' are adjusted to make the pattern thicker by about +5 nm, the transistors T, T', L, L' are pattern-corrected so that the simulation result becomes thicker than the design pattern.

Then, after pattern correction is performed under the reset convergence conditions, whether the current number of correction times is equal to the number of repeated correction times set by the user or not is determined (S108).

As a result of the determination, if the current number of correction times is less than the number of repeated correction times set by the user, the process returns to the above described step (S103), and the finished shape, dimensions, and the like of the transferred image are calculated.

On the other hand, if the current number of correction times has reached the number of repeated correction times set by the user, the above described series of pattern correction processing is ended. Specifically, it is conceivable that the number of repeated correction times is set to ten, and the above described series of pattern correction processing is repeatedly performed until the number of correction times reaches ten.

Figure 7:
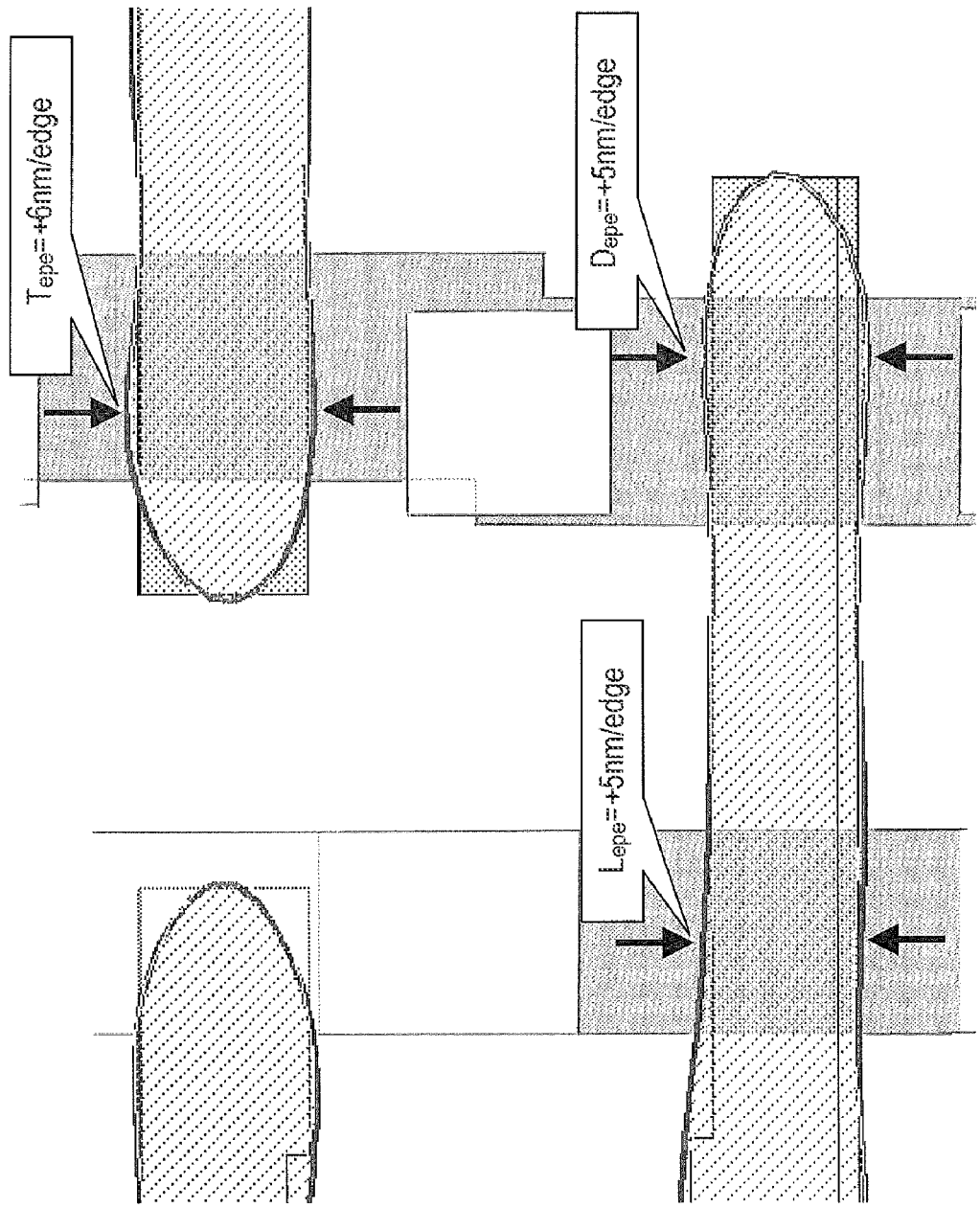
FIG. 7 is a pattern diagram showing a specific example of a pattern transfer simulation result in the first embodiment of the invention.

FIG. 7 is a pattern diagram showing a specific example of a pattern transfer simulation result in the first embodiment of the invention.

In the simulation result of the example in the drawing, the drive transistor D having the highest priority is finished to be thicker by +5 nm/edge than the design pattern. Further, with reference of the finished drive transistor D, the transfer transistor T and the load device L are finished to be thicker by about +5 nm/edge according to the amount of divergence between the drive transistor D and the design pattern.

In the pattern correction processing having the above described procedure, the amounts of divergence between the transfer simulation result and the design patterns are controlled while the memory cell area is shrunk in consideration of the performance differences of the respective transistors necessary for holding the desired characteristics of data retention, data writing, and data readout. Therefore, according to the pattern correction processing having the above described procedure, the influence by correction residue produced in mask pattern correction or the like can be reduced, and a mask pattern that enables a desired circuit characteristic and a stable operation of the circuit can be obtained.

Further, the pattern correction processing having the above described procedure can be applied to an SRAM memory cell using eight to ten transistors, for example. That is, even when the number of transistors as component elements becomes larger, if the order of priority is set for the respective transistors, pattern correction is performed on the semiconductor circuit pattern under the correction conditions that maintain the performance differences specified by the order of priority. Thereby, a desired circuit characteristic and a stable operation of the circuit can be obtained.

In addition, since the order of priority set in advance is used as reference, there is no influence by process limitation or the like in the semiconductor manufacturing process.

Second Embodiment

Next, a pattern evaluation method according to the second embodiment of the invention will be described.

Here, differences from the above described first embodiment will be mainly explained, and the explanation of the same configuration (e.g., "Schematic configuration of a pattern evaluation unit") will be omitted.

[Outline of Pattern Correction]

Here, the outline of pattern correction for a semiconductor circuit pattern having symmetrically arranged pairs of transistors as component elements will be briefly described.

For example, as the semiconductor circuit pattern, an SRAM memory cell is taken as an example. A one-port SRAM cell having a CMOS configuration has, as has been already described, the SRAM cell has three kinds of paired transistors having different functions such as drive transistors, transfer transistors, and load devices. Further, it is known that the characteristic differences between the paired transistors have great influence on the yield, performance, variations in characteristics, etc. of integrated circuits.

Note that the miniaturization of the circuit pattern of the SRAM cell is advanced as the memory size becomes smaller. Accordingly, at present, application of OPC is necessary for bringing the finished shape, dimensions, and the like closer to design values.

For example, the case where typical OPC is performed on the SRAM circuit pattern shown in FIG. 2 and a transfer simulation is performed on the mask pattern is considered.

Figure 8:
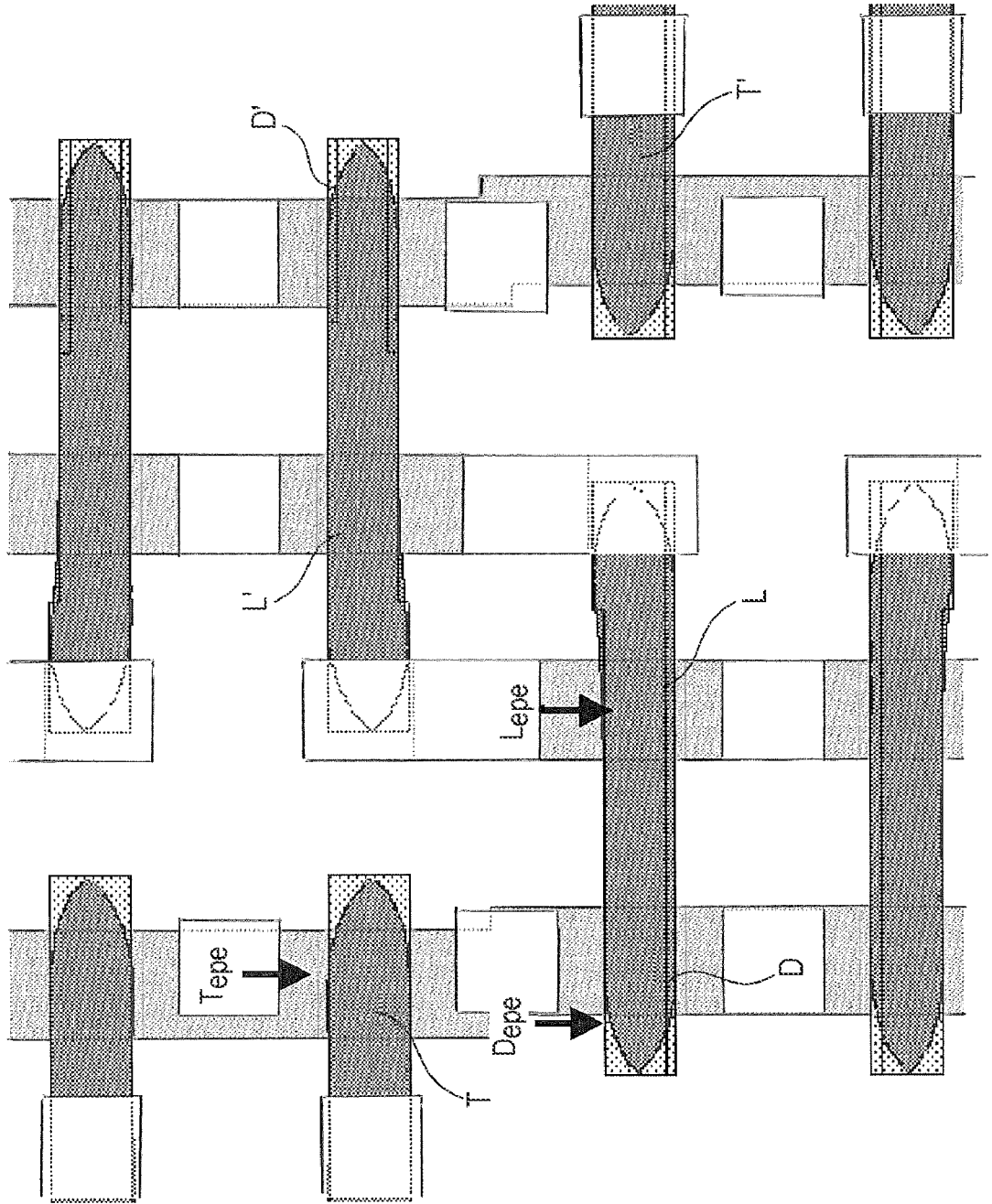
FIG. 8 is a pattern diagram showing a specific example of the pattern transfer simulation result after typical OPC.

FIG. 8 is a pattern diagram showing a specific example of the pattern transfer simulation result after typical OPC. In the drawing, Depe, Tepe, Lepe indicate the amounts of divergence between the simulation result and the design patterns of the respective transistors. The respective amounts of divergence (line widths) are Depe=−3 nm/edge, Tepe=−10 nm/edge, Lepe=+2 nm/edge, for example. These amounts of divergence are produced due to the influence by MEEF (Mask Error Enhancement Factor) or the like. Because of the amounts of divergence, the difference in gate length between the drive transistor D and the transfer transistor T becomes smaller from 10 nm at the design stage to 3 nm.

The dimension difference in gate length is set at the design stage for obtaining a desired circuit characteristic. Accordingly, breakage of the relationships of dimension differences may be factors that make the circuit operation unstable and cause the characteristic deterioration, the yield degradation, and the like.

Such pattern distortion may occur because of variations due to a semiconductor circuit manufacturing apparatus. Further, it may occur because of changes in a semiconductor circuit manufacturing process.

Here, the case where displacement of the gate layer pattern 1b occurs in the X-direction relative to the diffusion layer pattern 1a in the SRAM circuit pattern shown in FIG. 2 is considered.

Figure 9:
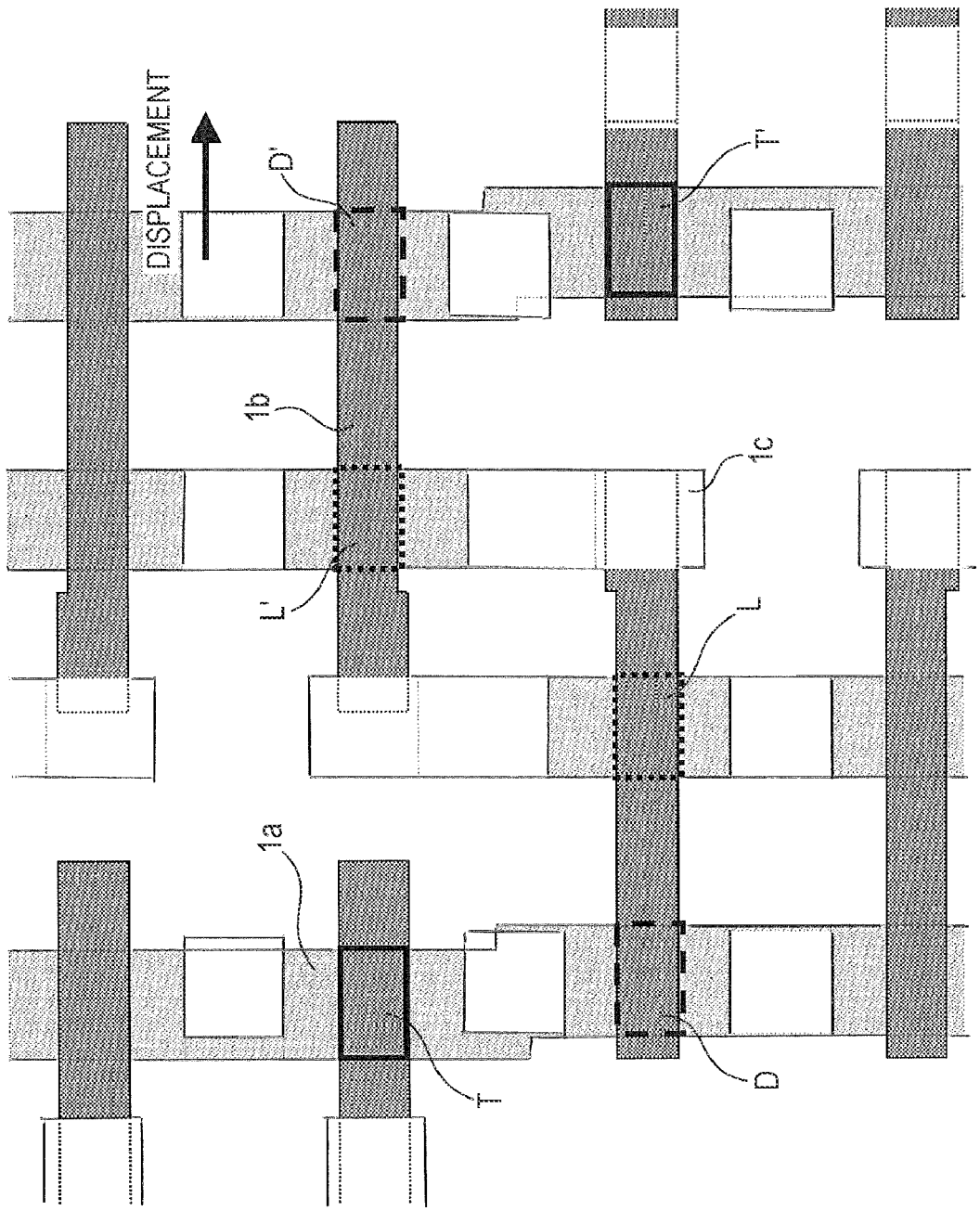
FIG. 9 is a pattern diagram showing a specific example of an SRAM circuit pattern when displacement occurs.

FIG. 9 is a pattern diagram showing a specific example of an SRAM circuit pattern when displacement occurs. As the example in the drawing, at this stage, there is no change in the transistor shapes in the respective paired transistors even when displacement occurs.

Figure 10:
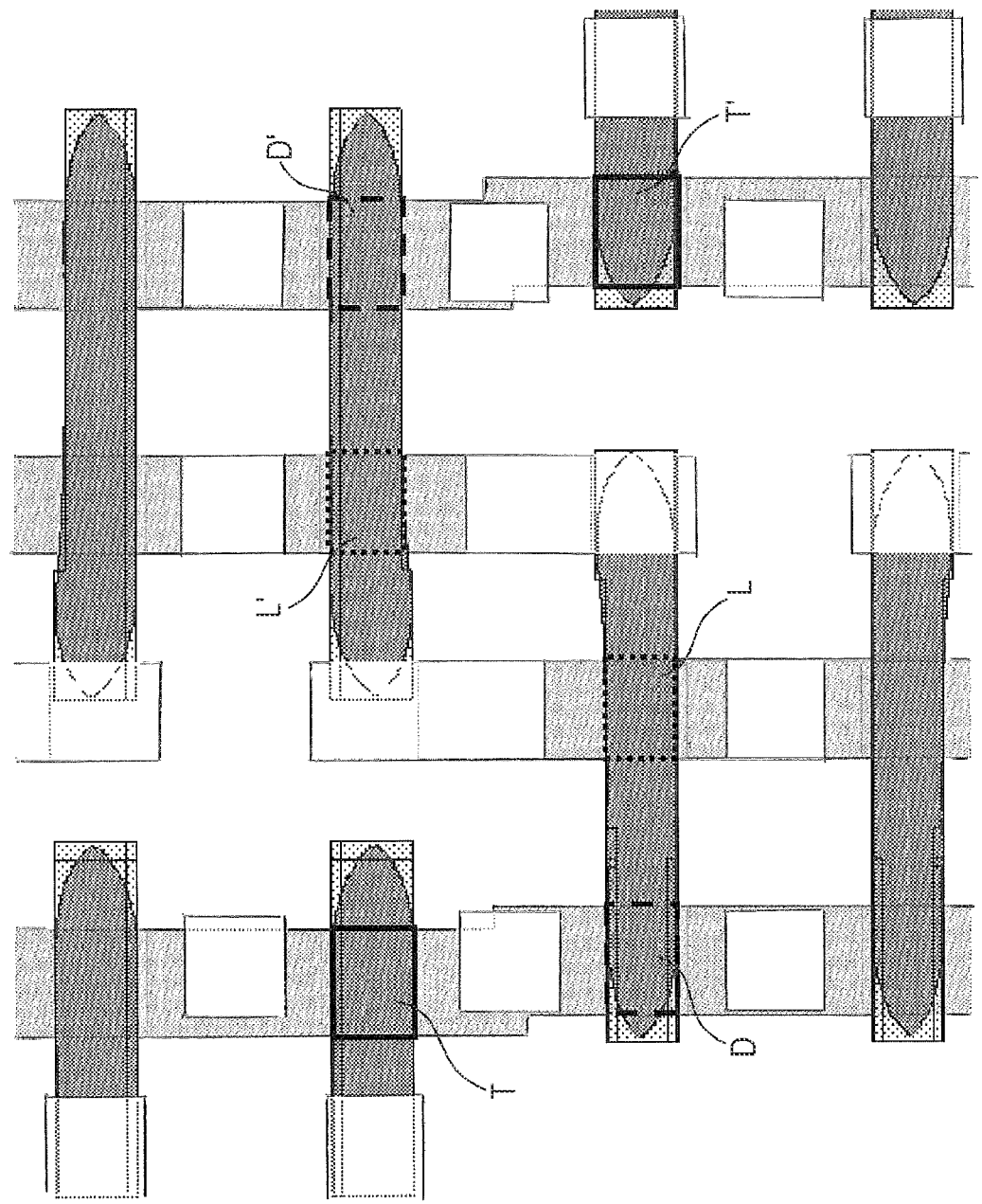
FIG. 10 is a pattern diagram showing a specific example of the pattern transfer simulation result when displacement Occurs.

Next, regarding the transfer simulation result with respect to the SRAM circuit pattern shown in FIG. 2, the case where the same displacement as that in FIG. 9 occurs is considered. FIG. 10 is a pattern diagram showing a specific example of the pattern transfer simulation result when displacement occurs. According to the example in the drawing, it is known that, because of rounded line ends of the gate layer pattern due to the process limitation, the finished shapes of the transistors largely vary in the paired transistors D, D', T, T', L, L'. For example, when attention is focused on the transfer transistors T, T', if displacement occurs in the X-direction, regarding one transistor T, there is no influence by the rounded line end because the transistor region moves to the line side, and the gate length does not become smaller. On the other hand, in the other transistor T', there is an influence by the rounded line end because the transistor region moves to the line end side due to displacement, and the gate length becomes smaller.

In this way, regarding the symmetrically arranged paired transistors, even when the layout design is made in view of symmetry, if displacement occurs, the symmetry of the paired transistors is broken because of the rounded line ends or the like due to the limitation of working process. Further, shape differences, dimension differences, or the like are produced between the paired transistors, and, as a result, there is concern that characteristic differences are produced between the paired transistors. When the characteristic differences between the paired transistors become larger, two stable states of the flip-flops are greatly unbalanced within the SRAM cell, and the stable state of one becomes degraded. Further, because of voltage changes due to noise, data becomes easier to be inversed and malfunction becomes easier to occur. The voltage margin for the noise is called SNM (Static Noise Margin). In a related art with no consideration of rounding due to the process limitation of the process or the like, SNM may be reduced due to displacement in the semiconductor manufacturing process.

When the expansion of the memory cell area is accepted, it is conceivable that pattern alteration is performed so that there may be no influence of the rounded pattern of the line ends. For example, to prevent the entrance of the rounded gates into the diffusion layer, pattern alteration that the gate layer pattern projecting from the diffusion layer is extended until the rounded gates do not enter the diffusion layer may be performed. However, the expansion of the memory cell area causes increase in cost and reduction in competitiveness. Accordingly, an improvement by the expansion of the memory cell area is not practical.

In view of the circumstances, in the embodiments described as below, regarding the symmetrically arranged paired transistors as component elements of a semiconductor circuit pattern, pattern correction is performed on the semiconductor circuit pattern in consideration of rounded pattern or the like due to the process limitation of the process. That is, by taking the symmetry of the paired transistors into consideration, the influence by pattern displacement, pattern distortion, and the like that may be produced in the semiconductor manufacturing process is eliminated while the characteristics of the respective paired transistors are optimized.

[Procedure of Pattern Correction]

Next, a procedure of the pattern correction for the semiconductor circuit pattern in the second embodiment will be explained.

Here, as is the case of the first embodiment, as the semiconductor circuit pattern to be pattern-corrected, the SRAM circuit pattern shown in FIG. 2 is taken as an example.

In the second embodiment, pattern correction for the SRAM circuit pattern is performed in the following procedure.

Figure 11:
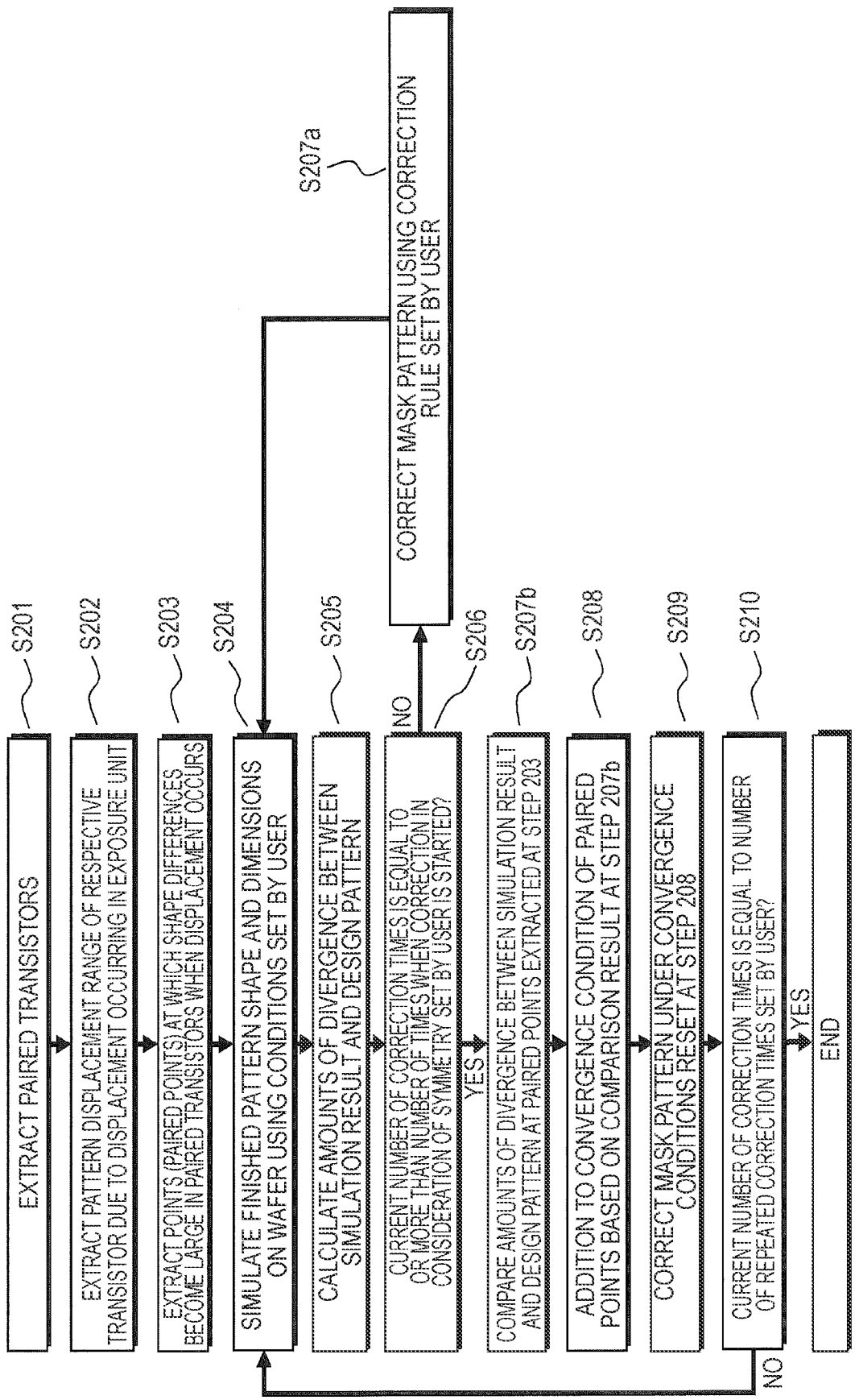
FIG. 11 is a flowchart showing an example of a procedure of a pattern correction method in a second embodiment of the invention.

FIG. 11 is a flowchart showing an example of a procedure of a pattern correction method in the second embodiment of the invention.

In pattern correction for the SRAM circuit pattern in which the respective transistors D, D', T, T', L, L' are point-symmetrically arranged with each other, first, extraction of the paired transistors is performed (S201). That is, regarding the respective transistors D, D', T, T', L, L', extraction of combinations forming pairs is performed. Specifically, the respective drive transistors D, D', transfer transistors T, T', and load devices L, L' are classified as the combinations forming pairs. It is conceivable that the classification is performed using layout dimensions of the respective transistors (specifically, dimensions specified by design layout information on gate lengths, gate widths, and the like, for example, or dimensions specified by design layout information on upper and lower layers of wiring layers, contact layers, via layers, or the like). Or, design intent information may be used for classification.

After the extraction of the paired transistors, then, displacement ranges of the respective transistors due to pattern displacement that can occur in the semiconductor manufacturing process are obtained (S202).

The magnitudes of the displacement that can occur in the semiconductor manufacturing process may be specified based on an actual value of the mask displacement of the exposure unit, a management specification of the unit, or the like in the lithography process in the semiconductor manufacturing. Specifically, it is conceivable that, as the magnitudes of the displacement of the respective transistors, the actual value of ±25 nm of the displacement of the exposure unit is used.

Further, it is conceivable that the displacement ranges of the respective transistors are obtained in the following manner.

Figure 12:
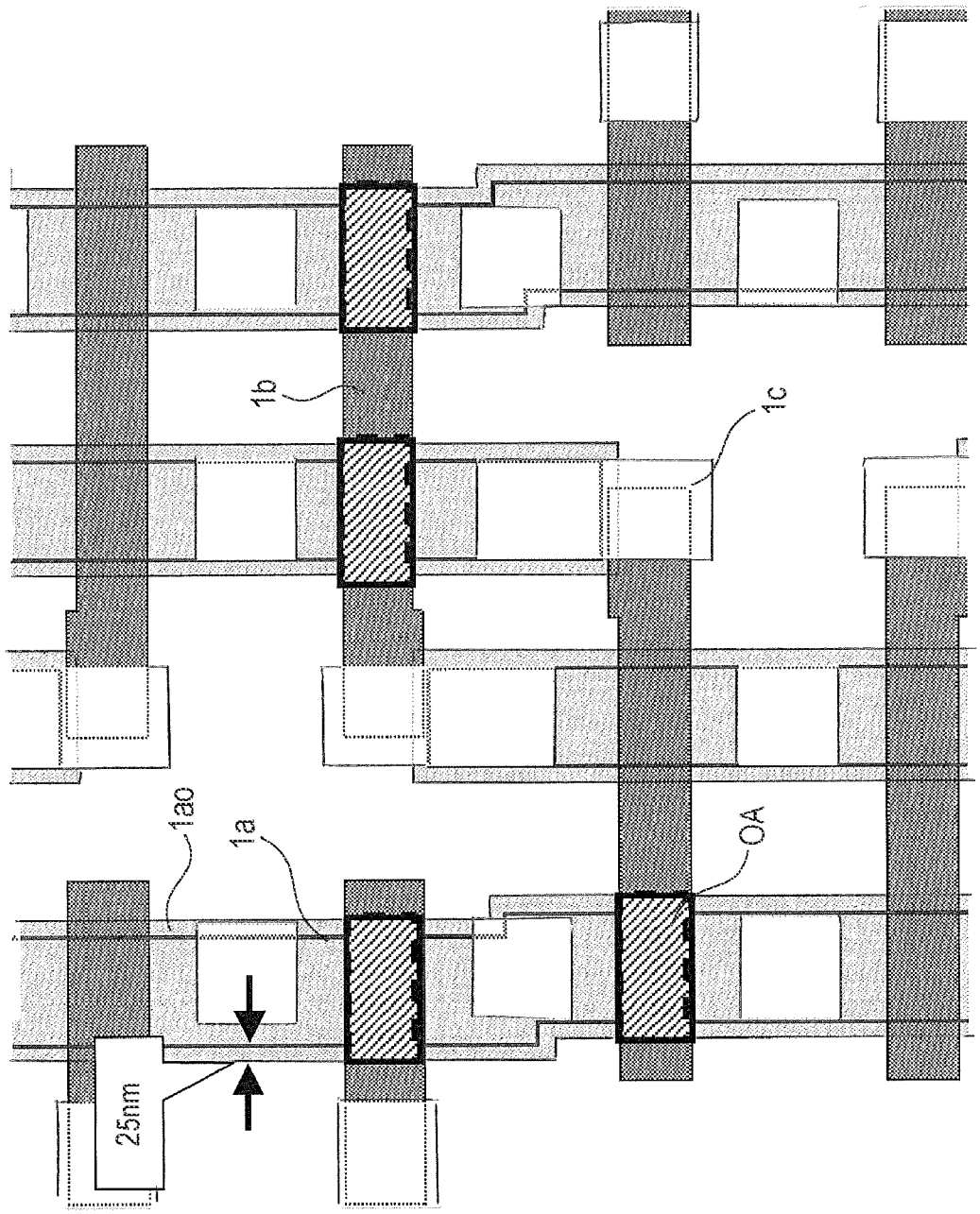
FIG. 12 is a pattern diagram showing a specific example of displacement ranges of the respective transistors.

FIG. 12 is a pattern diagram showing a specific example of displacement ranges of the respective transistors.

In the example in the drawing, to obtain the displacement range, the diffusion layer pattern 1a is oversized by the actual value of displacement. Further, an area in which the oversized diffusion layer pattern 1ao and the gate layer pattern 1b overlap is set to an area in which the transistor is produced due to the mask displacement of an exposure unit.

Afterwards, in order that the respective transistors forming the paired transistors maintain symmetry even when displacement occurs, points at which differences in pattern shape become larger when displacement occurs are extracted (S203). It is conceivable that the point extraction is performed in the following manner.

Figure 13:
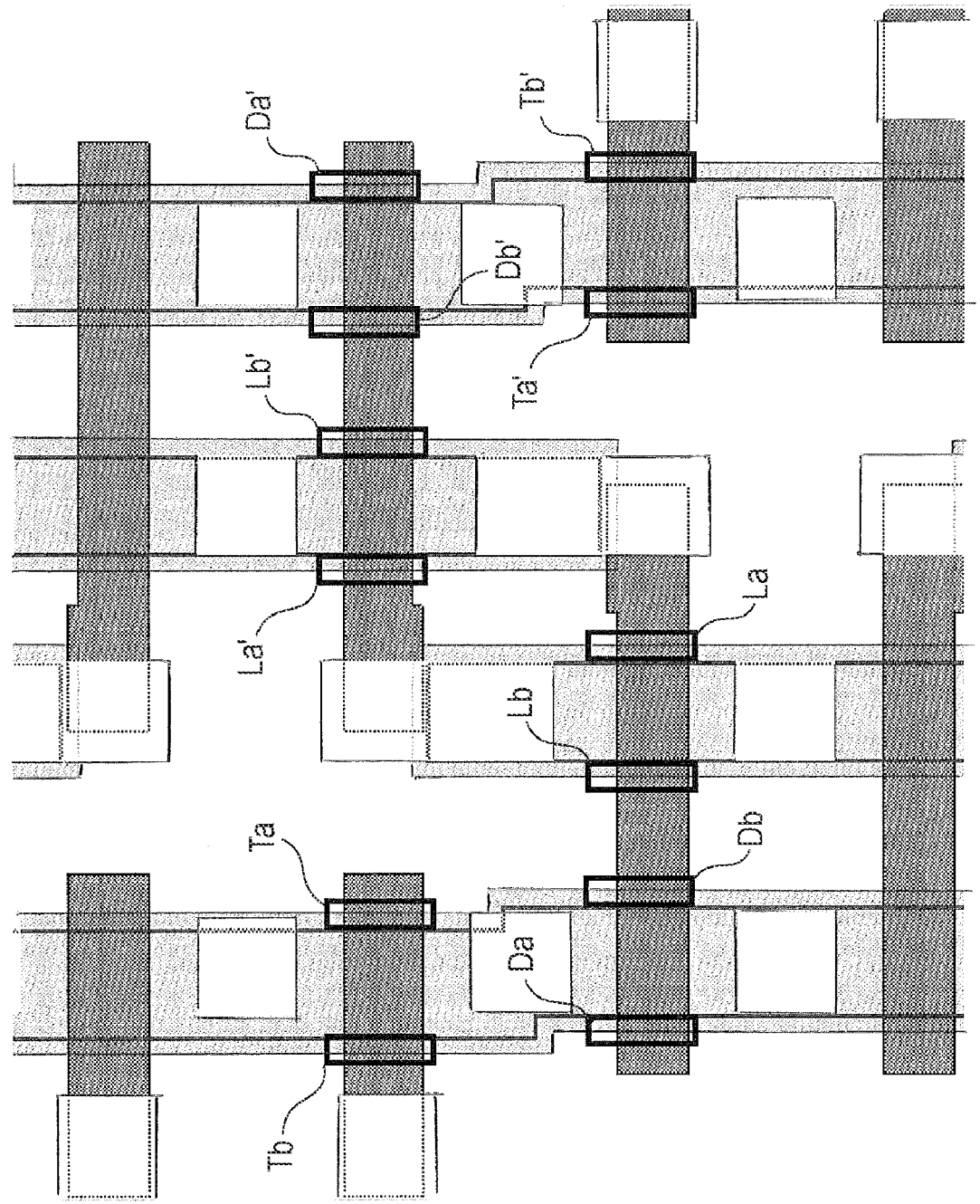
FIG. 13 is a pattern diagram showing a specific example of point extraction for consideration of symmetry due to displacement.

FIG. 13 is a pattern diagram showing a specific example of point extraction for consideration of symmetry due to displacement.

In the SRAM taken as an example here, the respective paired transistors are point-symmetrically arranged. However, in the case where displacement occurs in the diffusion layer and the gate layer in the X-direction due to rounded line ends of the gate layer pattern produced because of the process limitation according to pattern miniaturization, in the respective paired transistors, there are differences in pattern shape, pattern dimensions, or the like.

Accordingly, in the example in the drawing, for consideration of the symmetry by the displacement in the X-direction, regarding the drive transistors D, D', the line end Da of one transistor D and the line end Db' of the other transistor D' are defined as paired points of the drive transistors D, D'. Further, the line end Db of one transistor D and the line end Da' of the other transistor D' are also defined as paired points of the drive transistors D, D'.

Further, regarding the transfer transistors T, T', the line end Ta of one transistor T and the line end Tb' of the other transistor T' are defined as paired points of the transfer transistors T, T'. Further, the line end Tb of one transistor T and the line end Ta' of the other transistor T' are also defined as paired points of the transfer transistors T, T'.

Further, regarding the load devices L, L', the line end La of one transistor L and the line end Lb' of the other transistor L' are defined as paired points of the load devices L, L'. Further, the line end Lb of one transistor L and the line end La' of the other transistor L' are also defined as paired points of the load devices L, L'.

As described above, the paired points extracted here correspond to points at which the shapes should be the same for maintaining the symmetry even when displacement occurs.

Note that, displacement in Y-direction is omitted here because the displacement has no influence on the characteristic of the memory cell if it is within the displacement range set at the above described step (S202).

After extraction of the paired points, regarding the current SRAM circuit pattern, the finished shape, dimensions, and the like of a transferred image obtained by exposure and transfer of the SRAM circuit pattern are calculated (S204). The exposure and transfer are performed using an arbitrary condition set by a user. Further, the calculation of the finished shape, dimensions, and the like is performed by a resist shape simulation, a processed shape simulation, or the like. Note that the calculation may be performed by a simulation in consideration of variations in the dose, focus, or the like in the lithography process.

Then, after the simulation is performed, the simulation result and the design pattern of the SRAM circuit are compared and amounts of divergence between them are extracted (S205).

As a specific example of the amounts of divergence between the simulation result and the design patterns, the example shown in FIG. 5 is cited. In the drawing, Depe, Tepe, Lepe indicate the amounts of divergence between the simulation result and the design patterns of the respective transistors. The respective amounts of divergence (line widths) are Depe=+5 nm/edge, Tepe=+2.5 nm/edge, Lepe=+2 nm/edge, for example.

Then, whether the current number of correction times is equal to or more than the number of times when correction in consideration of symmetry set by the user is started or not is determined (S206).

At the initial stage of the correction, since the amounts of divergence between the simulation result and the design patterns are large, if OPC in consideration of symmetry is performed under the condition, the OPC may be diverged. Accordingly, it is desirable that the OPC in consideration of symmetry is performed after the number of correction times exceeds the number of correction times at which the OPC is converged to some degree. On this account, the above described determination is performed.

Specifically, it is conceivable that the OPC in consideration of symmetry is started from the number of correction times of eight.

As a result of the determination, if the current number of correction times is less than the times when the correction in consideration of symmetry set by the user is started, the pattern correction on the SRAM circuit pattern is performed (S207a) based on the correction conditions (rules) set by the user in advance and the amounts of divergence extracted at the above described step (S205). Further, after the pattern correction, the step (S204) of calculating the finished shape, dimensions, and the like of the transferred image is performed.

On the other hand, if the current number of correction times is equal to or more than the times when the correction in consideration of symmetry set by the user is started, regarding the respective paired points extracted at the above described step (S203), the simulation results and the amounts of divergence are extracted and compared to each other (S207b).

Figure 14:
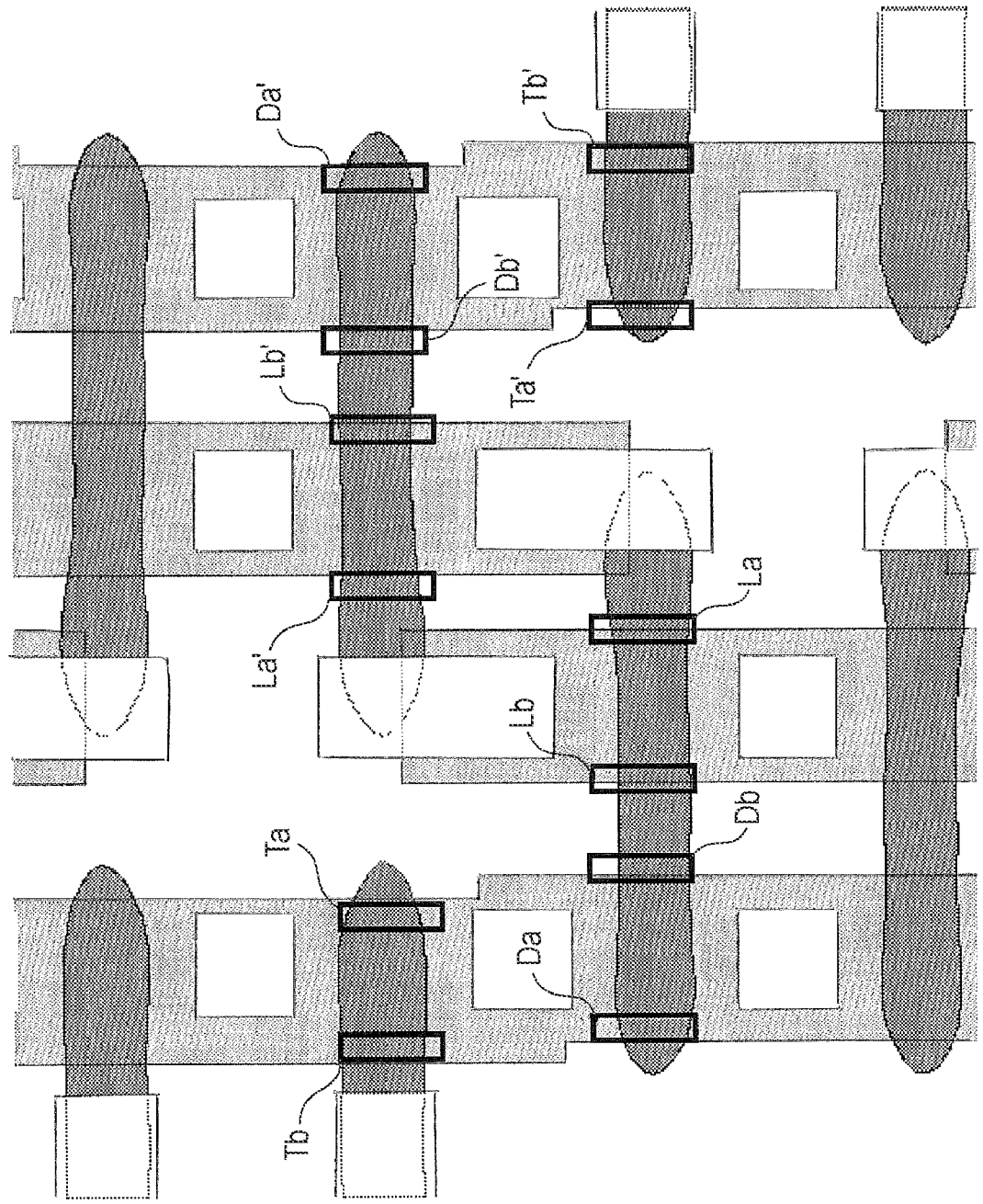
FIG. 14 is a pattern diagram showing a specific example of amounts of divergence between a simulation result and a design pattern in pair points.

FIG. 14 is a pattern diagram showing a specific example of amounts of divergence between a simulation result and a design pattern in paired points.

In the example in the drawing, while the amount of divergence of the point Da in the drive transistors D, D' is −15 nm/edge, the amount of divergence of the point Db' forming a pair with the point Da is 0 nm. Further, while the amount of divergence of the point Db is 0 nm/edge, the amount of divergence of the point Da' forming a pair with the point Db is −17 nm/edge.

After the amounts of divergence with respect to the respective paired points are extracted and compared to each other, the correction conditions for the pattern correction are adjusted based on the comparison result. In this regard, the correction condition for the pattern correction is adjusted so that the amount of pattern distortion with respect to one transistor forming the paired transistors may be made equal to the amount of pattern distortion with respect to the other transistor forming the paired transistors. Specifically, with reference to the amounts of divergence with respect to the respective paired points, the amount of divergence generated at the one of the paired points is added to the convergence condition of the pattern correction for the other of the paired points (S208).

For example, the case where the convergence conditions of the pattern correction is set to ±1 nm/edge for the design pattern is considered. In this case, if the amount of divergence generated at point Da in the drive transistors D is added to the convergence condition of the point Db' forming a pair with the point Da, the convergence condition with respect to the point Db' is −14 to 16 nm/edge.

In adjustment of the correction conditions, which amount of divergence of the respective amounts of divergence at the paired points is added to the convergence condition of the pattern correction of the other is problematic. Regarding the problem, it is conceivable that the determination according to the size of the respective alteration room at the paired points may be preset.

This is because, at pattern correction, the divergence difficult to be improved only by the pattern correction can partially occur. Such divergence can occur due to the process limitation because of miniaturization, the amount of exposure in the lithography process, the margin of defocusing, the limitation of mask pattern correction because of restrictions of mask manufacturing, or the like.

That is, in adjustment of the correction conditions, with reference to the side at which the divergence difficult to be improved only by the pattern correction occurs, the convergence condition of the mask pattern correction may be changed so that the shapes and the dimensions (the amounts of pattern divergence) may be equal between the paired points. In other words, the adjustment of the correction conditions may be performed so that the amount of pattern distortion having large alteration room is made equal to the amount of pattern distortion having small alteration room.

Then, pattern correction is performed (S209) on the SRAM circuit pattern based on the OPC convergence conditions reset at the above described step (S208). In this regard, as described above, if the convergence condition of the point Db' is adjusted to be thinner by about −15 nm relative to the design pattern with reference to the amount of divergence of the point Da, the pattern correction is performed so that the simulation result at the point Db' may become thinner.

Then, after pattern correction is performed under the reset convergence conditions, whether the current number of correction times is equal to the number of repeated correction times set by the user or not is determined (S210).

As a result of the determination, if the current number of correction times is less than the number of repeated correction times set by the user, the process returns to the above described step (S204), and the finished shape, dimensions, and the like of the transferred image are calculated.

On the other hand, if the current number of correction times has reached the number of repeated correction times set by the user, the above described series of pattern correction processing is ended. Specifically, it is conceivable that the number of repeated correction times is set to ten, and the above described series of pattern correction processing is repeatedly performed until the number of correction times reaches ten.

Figure 15:
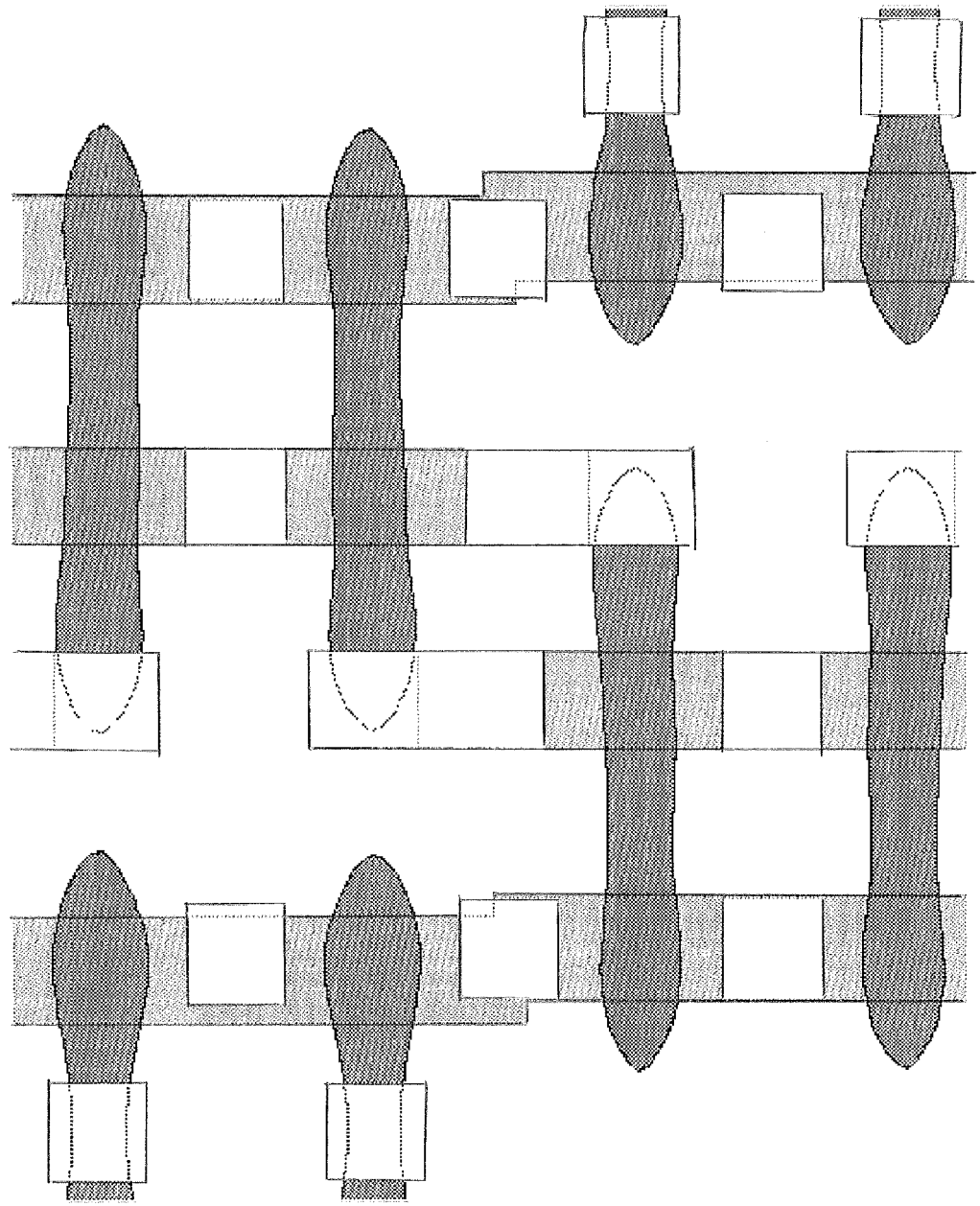
FIG. 15 is a pattern diagram showing a specific example of a pattern transfer simulation result in the second embodiment of the invention.

FIG. 15 is a pattern diagram showing a specific example of a pattern transfer simulation result in the second embodiment of the invention.

In the simulation result of the example in the drawing, it is known that the shapes of the respective paired points in the respective pair transistors are the same.

Figure 16:
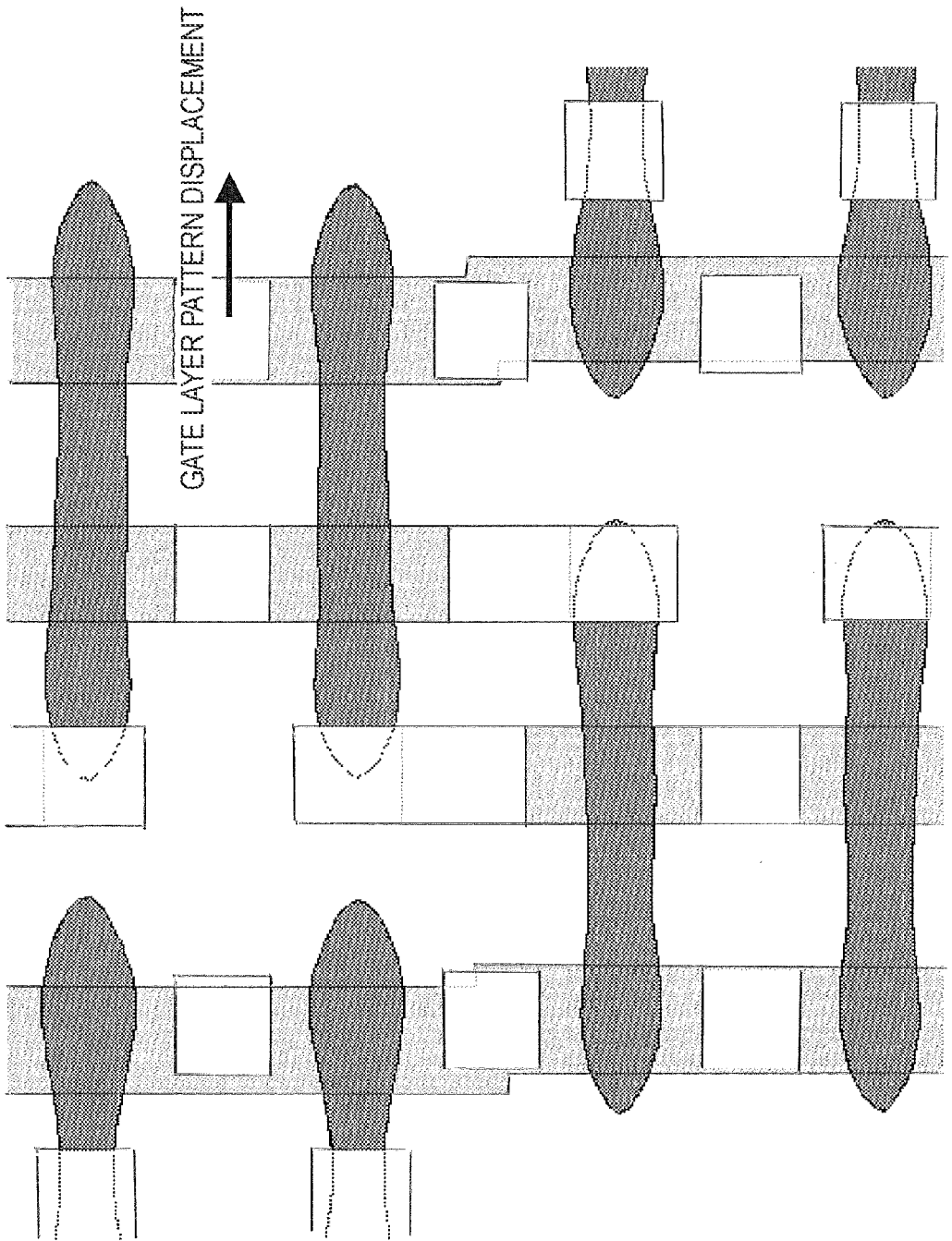
FIG. 16 is a pattern diagram showing a specific example in which a gate layer pattern shown in FIG. 15 has been displaced in X-direction.

FIG. 16 is a pattern diagram showing a specific example in which the gate layer pattern shown in FIG. 15 has been displaced in X-direction.

In the example in the drawing, it is known that, even when displacement occurs, great shape divergence between the paired transistors that has been generated in the related art is suppressed, and the transistor shapes are the same between the paired transistors. Therefore, even when displacement occurs, stable condition of the flip-flops can be held.

In the pattern correction processing having the above described procedure, the correction conditions for the pattern correction are adjusted so that the amount of pattern distortion with respect to one transistor forming the paired transistors may be made equal to the amount of pattern distortion with respect to the other transistor forming the paired transistors. Therefore, according to the correction processing having the above described procedure, even in the case where pattern displacement or the like occurs when there are rounded line ends due to the limitation of the working process, generation of characteristic differences between the paired transistors can be prevented.

In addition, since one amount of pattern divergence may be made equal to the other amount of pattern divergence, the adjustment of the correction conditions can be reliably performed by making the amount having large alteration room equal to the amount having small alteration room.

Note that, in the embodiment, the case where symmetry is held with reference to the gate lengths of the transistors has been taken as an example, however, not necessarily limited to that, gate areas of the transistors or the like may be used as reference. Further, in the case where the symmetry of the diffusion layer is considered, the gate widths of the transistors or the like may be used as reference.

Third Embodiment

Next, a pattern evaluation method according to the third embodiment of the invention will be described.

Here, differences from the above described first or second embodiment will be mainly explained, and the explanation of the same configuration (e.g., "Schematic configuration of a pattern evaluation unit") will be omitted.

[Outline of Pattern Correction]

Here, the pattern correction described here corresponds to a combination of the above described first and second embodiments.

[Procedure of Pattern Correction]

Next, a procedure of the pattern correction for the semiconductor circuit pattern in the third embodiment will be explained.

Here, as is the case of the first or second embodiment, as the semiconductor circuit pattern to be pattern-corrected, the SRAM circuit pattern shown in FIG. 2 is taken as an example.

In the third embodiment, pattern correction for the SRAM circuit pattern is performed in the following procedure.

FIG. 17 is a flowchart showing an example of a procedure of the pattern correction method in the third embodiment of the invention.

In pattern correction for the SRAM circuit pattern, first, regarding the respective paired transistors D, D', T, T', L, L' as the component elements of the SRAM circuit pattern, their kinds are classified (S301). That is, which of the drive transistors D, D', the transfer transistors T, T', or the load devices L, L' is classified. This classification may be performed in the same manner as that of the first embodiment.

After the classification of the kinds of transistors, then, the order of priority by kind is recognized with respect to the respective paired transistors D, D', T, T', L, L' while referring to preset relational expressions of the transistor performances (S302). The recognition of the order of priority may be performed in the same manner as that of the first embodiment. Thereby, for example, the order of priority is given in consideration of the performance differences of the respective paired transistors so that the drive transistors D, D' may have the highest importance and the highest priority, the transfer transistors T, T' may be the next higher, and the load devices L, L' may have the lowest importance.

After the order of priority is recognized, with respect to each of the classified kinds of transistors, extraction of the paired transistors is performed (S303). That is, regarding the respective transistors D, D', T, T', L, L', extraction of combinations forming pairs is performed. Specifically, the respective drive transistors D, D', transfer transistors T, T', and load devices L, L' are classified as the combinations forming pairs. The classification may be performed in the same manner as that of the second embodiment.

After the extraction of the paired transistors, then, displacement ranges of the respective transistors due to pattern displacement that can occur in the semiconductor manufacturing process are obtained (S304).

The magnitudes of the displacement that can occur in the semiconductor manufacturing process may be specified based on an actual value of the mask displacement of the exposure unit, a management specification of the unit, or the like in the lithography process in the semiconductor manufacturing as is the case of the second embodiment. Specifically, it is conceivable that, as the magnitudes of the displacement of the respective transistors, the actual value of ±25 nm of the displacement of the exposure unit is used.

Further, it is conceivable that the displacement ranges of the respective transistors are obtained in the same manner as that of the second embodiment. Specifically, as shown in FIG. 12, the diffusion layer pattern 1a is oversized by the actual value of displacement, and an area in which the oversized diffusion layer pattern 1ao and the gate layer pattern 1b overlap is set to an area in which the transistor is generated due to the mask displacement of the exposure unit.

Afterwards, in order that the respective transistors forming the paired transistors maintain symmetry even when displacement occurs, points at which differences in pattern shape become larger when displacement occurs are extracted (S305). This point extraction may be performed in the same manner as that of the second embodiment.

Specifically, as shown in FIG. 13, regarding the drive transistors D, D', the line end Da of one transistor D and the line end Db' of the other transistor D' are defined as paired points of the drive transistors D, D'. Further, the line end Db of one transistor D and the line end Da' of the other transistor D' are also defined as paired points of the drive transistors D, D'.

Further, regarding the transfer transistors T, T', the line end Ta of one transistor T and the line end Tb' of the other transistor T' are defined as paired points of the transfer transistors T, T'. Further, the line end Tb of one transistor T and the line end Ta' of the other transistor T' are also defined as paired points of the transfer transistors T, T'.

Further, regarding the load devices L, L', the line end La of one transistor L and the line end Lb' of the other transistor L' are defined as paired points of the load devices L, L'. Further, the line end Lb of one transistor L and the line end La' of the other transistor L' are also defined as paired points of the load devices L, L'.

As described above, the paired points extracted here correspond to points at which the shapes should be the same for maintaining the symmetry even when displacement occurs.

After extraction of the paired points, regarding the current SRAM circuit pattern, the finished shape, dimensions, and the like of a transferred image obtained by exposure and transfer of the SRAM circuit pattern are calculated (S306). The exposure and transfer are performed using an arbitrary condition set by a user. Further, the calculation of the finished shape, dimensions, and the like is performed by a resist shape simulation, a processed shape simulation, or the like. Note that the calculation may be performed by a simulation in consideration of variations in the dose, focus, or the like in the lithography process.

Then, after the simulation is performed, the simulation result and the design pattern of the SRAM circuit are compared and amounts of divergence between them are extracted (S307). Specifically, as shown in FIG. 5, for example, the amounts of divergence (line widths) such as Depe=+5 nm/edge, Tepe=+2.5 nm/edge, Lepe=+2 nm/edge are calculated.

Then, whether the current number of correction times is equal to or more than the number of times when correction in consideration of symmetry set by the user is started or not is determined (S308).

At the initial stage of the correction, since the amounts of divergence between the simulation result and the design patterns are large, if OPC in consideration of symmetry is performed under the condition, the OPC may be diverged. Accordingly, it is desirable that the OPC in consideration of symmetry is performed after the number of correction times exceeds the number of correction times at which the OPC is converged to some degree. On this account, the above described determination is performed.

Specifically, it is conceivable that the OPC in consideration of symmetry is started from the number of correction times of eight.

As a result of the determination, if the current number of correction times is less than the times when the correction in consideration of symmetry set by the user is started, the pattern correction on the SRAM circuit pattern is performed (S309a) based on the correction conditions (rules) set by the user in advance and the amounts of divergence extracted at the above described step (S307). Further, after the pattern correction, the step (S306) of calculating the finished shape, dimensions, and the like of the transferred image is performed.

On the other hand, if the current number of correction times is equal to or more than the times when the correction in consideration of symmetry set by the user is started, subsequently, whether the current number of correction times is equal to or more than the number of times when correction in consideration of the order of priority set by the user is started or not is determined (S309b).

This is for holding the symmetry and holding the performance relationships between the transistors by performing OPC in consideration of the order of priority and the amounts of divergence between the simulation result and the design patterns generated due to correction in consideration of symmetry.

Specifically, it is conceivable that the OPC in consideration of the order of priority is set to be started from the number of correction times of ten.

As a result of the determination, if the current number of correction times is less than the times when the correction in consideration of the order of priority set by the user is started, regarding the respective paired points extracted at the above described step (S305), the simulation results and the amounts of divergence are extracted and compared to each other (S310a). Specifically, as shown in FIG. 14, for example, a comparison result that, while the amount of divergence of the point Da in the drive transistors D, D' is −15 nm/edge, the amount of divergence of the point Db' forming a pair with the point Da is 0 nm is obtained. Further, a comparison result that, while the amount of divergence of the point Db is 0 nm/edge, the amount of divergence of the point Da' forming a pair with the point Db is −17 nm/edge is obtained.

After the amounts of divergence of the respective point pairs are extracted and compared to each other, the correction conditions for the pattern correction are adjusted based on the comparison result. In this regard, with reference to the amounts of divergence with respect to the respective paired points, the amount of divergence generated at the one of the paired points is added to the convergence condition of the pattern correction for the other of the paired points (S310b).

For example, the case where the convergence conditions of the pattern correction is set to ±1 nm/edge for the design pattern is considered. In this case, if the amount of divergence generated at point Da in the drive transistors D is added to the point Db' forming a pair with the point Da, the convergence condition with respect to the point Db' is −14 to 16 nm/edge.

The determination as to which amount of divergence of the point is added to the convergence condition of the pattern correction of the point forming the pair with that point may be performed in the same manner as that of the second embodiment. That is, with reference to the side at which the divergence difficult to be improved only by the pattern correction occurs, the convergence condition of the mask pattern correction may be changed so that the shapes and the dimensions (the amounts of pattern divergence) may be equal between the paired points.

On the other hand, as a result of the determination at the above described step (S309b), if the current number of correction times is equal to or more than the times when the correction in consideration of the order of priority set by the user is started, the correction conditions for the pattern correction are adjusted based on the order of priority recognized at the above described step (S302) with reference to the transistor having the highest priority. Specifically, with reference to the amount of divergence of the transistor having the highest priority, the amount of divergence of the transistor having the highest priority is added to the convergence conditions of the pattern correction of the other transistors (S310c).

Then, pattern correction is performed (S311) on the SRAM circuit pattern based on the convergence conditions reset at the above described step (S310b) or step (S310c).

Then, after pattern correction is performed under the reset convergence conditions, whether the current number of correction times is equal to the number of repeated correction times set by the user or not is determined (S312).

As a result of the determination, if the current number of correction times is less than the number of repeated correction times set by the user, the process returns to the above described step (S306), and the finished shape, dimensions, and the like of the transferred image are calculated.

On the other hand, if the current number of correction times has reached the number of repeated correction times set by the user, the above described series of pattern correction processing is ended. Specifically, it is conceivable that the number of repeated correction times is set to twelve, and the above described series of pattern correction processing is repeatedly performed until the number of correction times reaches twelve.

In the pattern correction processing having the above described procedure, even when displacement occurs, great divergence in shape, dimensions, or the like between the pair transistors can be suppressed. In addition, the breakage of the performance relationships between the transistors due to the divergence between the finished shapes and dimensions and the design patterns generated by the process limitation, the lithography margin, restrictions of mask manufacturing, or the like can be suppressed.

Therefore, according to the pattern correction processing having the above described procedure, while the memory cell area is shrunk and the desired characteristics of data retention, data writing, and data readout are secured, the memory circuit can stably be operated even when displacement occurs.

Fourth Embodiment

Next, an exposure mask, a manufacturing method of an exposure mask, and a manufacturing method of a semiconductor device according to the fourth embodiment of the invention will be described.

It is conceivable that the pattern correction processing explained in the above described first to third embodiments is performed in a manufacturing process of a semiconductor device. That is, in the manufacturing process of the semiconductor device, after a mask pattern is determined through the above described series of pattern correction processing, an exposure mask having the determined mask pattern is fabricated. Then, using the fabricated exposure mask, a lithography process is executed, and thereby, a circuit pattern is formed on a wafer surface.

[Exposure Mask and Manufacturing Method Thereof]

It is conceivable that the exposure mask is fabricated in the following manner.

Through the pattern correction processing explained in one of the above described first to third embodiments, a mask pattern as a base of a circuit pattern formed on the wafer surface (transferred image) is determined. That is, from a pattern correction unit, information that specifies the mask pattern after pattern correction (hereinafter, referred to as "corrected pattern") is output.

Therefore, if information on the corrected pattern is output from the pattern correction unit, then, using the output information from the pattern correction unit, an exposure mask having a mask pattern specified by the output information is fabricated. The method of fabricating the mask is not specifically limited, but a known technology may be used.

Thereby, after the mask fabrication process, the exposure mask having the corrected pattern determined through the pattern correction processing in one of the above described first to third embodiments as a mask pattern is obtained.

[Manufacturing Method of Semiconductor Device and Exposure Method for Pattern Formation]

After the exposure mask is obtained, using the exposure mask, the circuit pattern can be formed on the wafer surface. That is, using the exposure mask formed to have the corrected pattern as a mask pattern, the mask pattern is pattern-transferred onto the wafer surface as a surface to be exposed, and the circuit pattern as a transferred image of the mask pattern is formed on the wafer surface.

Thereby, on the wafer surface as a component substrate (semiconductor substrate) of the semiconductor device, the corrected pattern determined through the pattern correction processing in one of the above described first to third embodiments is exposed and transferred. Thereby, the circuit pattern as the transferred image of the corrected pattern is formed.

If the circuit pattern is formed through exposure and transfer of the corrected pattern, on the wafer surface, the circuit pattern without characteristic difference between paired transistors or breakage of the performance relationships between the respective transistors can be obtained.

Therefore, if semiconductor devices are manufactured through the above described series of procedures, as a result, the semiconductor devices advantageous in electric characteristics can be efficiently manufactured with high yield.

Note that, in the above described respective first to fourth embodiments, the preferred specific working examples have been explained, however, the invention is not limited to the configurations.

That is, specific forms and numeric values of the respective parts exemplified in the respective embodiments are just some embodied examples at implementation of the invention, the technical scope of the invention should not be interpreted to a limited extent.

Further, in the respective examples, the case where pattern correction is performed on the SRAM circuit pattern has been described as examples, however, the invention may be applied all the same to other semiconductor circuit patterns such as a circuit pattern forming pixel cells of an imager, for example.

As described above, the invention is not limited to the configuration described in the embodiments, and appropriate changes can be made without departing from the scope of the invention.

The present application contains subject matter related to that disclosed in Japanese Priority Patent Application JP 2009-011689 filed in the Japan Patent Office on Jan. 22, 2009, the entire contents of which is hereby incorporated by reference.

What is claimed is:

1. A pattern correction method comprising:
performing pattern correction on a semiconductor circuit pattern having plural transistors as component elements,
wherein the pattern correction is based on
an order of priority set with respect to the plural transistors, and
an extracted divergence of a highest-priority transistor of the plural transistors, the extracted divergence being a divergence between the semiconductor circuit pattern and a result of a simulated transfer, the extracted divergence added to convergence conditions for the pattern correction of lower-priority transistors of the plural transistors.

2. The pattern correction method according to claim 1, wherein the order of priority is set based on desired performances and functions for the plural transistors, the functions of highest importance having highest priority.

3. An exposure mask comprising:
a semiconductor circuit pattern having plural transistors as component elements, wherein the semiconductor circuit pattern is formed based on,
an order of priority set with respect to the plural transistors, and
an extracted divergence of a highest-priority transistor of the plural transistors, the extracted divergence being a divergence between the semiconductor circuit pattern and a result of a simulated transfer, the extracted divergence added to convergence conditions for the pattern correction of lower-priority transistors of the plural transistors.

4. A manufacturing method of an exposure mask comprising:
performing pattern correction on a semiconductor circuit pattern having plural transistors as component elements; based on (i) an order of priority set with respect to the plural transistors and (ii) an extracted divergence of a highest-priority transistor of the plural transistors, the extracted divergence being a divergence between the semiconductor circuit pattern and a result of a simulated transfer, the extracted divergence added to convergence conditions for the pattern correction of lower-priority transistors of the plural transistors; and
fabricating an exposure mask having a mask pattern corresponding to the semiconductor circuit pattern after the pattern correction.

5. A manufacturing method of a semiconductor device comprising:
performing pattern correction on a semiconductor circuit pattern having plural transistors as component elements based on (i) an order of priority set with respect to the plural transistors and (ii) an extracted divergence of a highest-priority transistor of the plural transistors, the extracted divergence being a divergence between the semiconductor circuit pattern and a result of a simulated transfer, the extracted divergence added to convergence conditions for the pattern correction of lower-priority transistors of the plural transistors; and
forming a transferred image onto a semiconductor substrate using an exposure mask having a mask pattern corresponding to the semiconductor circuit pattern after the pattern correction.

6. A pattern correction method comprising:
recognizing amounts of pattern distortion when a semiconductor circuit pattern having a symmetrically arranged pair of transistors as component elements is exposed and transferred onto a semiconductor substrate; and
performing pattern correction on the semiconductor circuit pattern based on the recognized amounts of pattern distortion so that the amount of pattern distortion with respect to one transistor forming the pair of transistors is equal to the amount of pattern distortion with respect to the other transistor forming the pair of transistors in the pattern correction.

7. The pattern correction method according to claim 6, wherein an amount of pattern distortion having larger alteration room is equal to an amount of pattern distortion having smaller alteration room.

8. An exposure mask comprising:
a semiconductor circuit pattern having a symmetrically arranged pair of transistors as component elements exposed and transferred onto a semiconductor substrate based on pattern correction performed on the semiconductor circuit pattern so that the amount of pattern distortion between the semiconductor circuit pattern and a result of a simulated transfer with respect to one transistor forming the pair of transistors is equal to the amount of pattern distortion with respect to the other transistor forming the pair of transistors.

9. A manufacturing method of an exposure mask comprising:
recognizing amounts of pattern distortion when a semiconductor circuit pattern having a symmetrically arranged pair of transistors as component elements is exposed and transferred onto a semiconductor substrate;
performing pattern correction on the semiconductor circuit pattern based on the recognized amounts of pattern distortion so that the amount of pattern distortion with respect to one transistor forming the pair of transistors is equal to the amount of pattern distortion with respect to the other transistor forming the pair of transistors; and
fabricating an exposure mask having a mask pattern corresponding to the semiconductor circuit pattern after the pattern correction.

10. A manufacturing method of a semiconductor device comprising:
recognizing amounts of pattern distortion when a semiconductor circuit pattern having a symmetrically arranged pair of transistors as component elements is exposed and transferred onto a semiconductor substrate;
performing pattern correction on the semiconductor circuit pattern based on the recognized amounts of pattern distortion so that the amount of pattern distortion with respect to one transistor forming the pair of transistors is equal to the amount of pattern distortion with respect to the other transistor forming the pair of transistors; and
forming a transferred image onto a semiconductor substrate using an exposure mask having a mask pattern corresponding to the semiconductor circuit pattern after the pattern correction.

11. A pattern correction method comprising:
recognizing amounts of pattern distortion when a semiconductor circuit pattern having symmetrically arranged plural pairs of transistors as component elements is exposed and transferred onto a semiconductor substrate; and
performing pattern correction on the semiconductor circuit pattern based on (i) an order of priority set with respect to the plural pairs of transistors and (ii) the recognized amounts of pattern distortion so that the amount of pattern distortion with respect to one transistor forming the pair of transistors is equal to the amount of pattern distortion with respect to the other transistor forming the pair of transistors in the pattern correction, the pattern correction adjusted based on the pair of transistors having highest priority.

12. The pattern correction method according to claim 11, wherein, and amount of pattern distortion having larger alteration room is equal to an amount of pattern distortion having smaller alteration room.

13. The pattern correction method according to claim 11 or 12, wherein the order of priority is set based on desired performances and functions requested for the plural pairs of transistors, the functions of highest performance having highest priority.

14. An exposure mask comprising:
a semiconductor circuit pattern having symmetrically arranged plural pairs of transistors as component elements is exposed and transferred onto a semiconductor substrate based on pattern correction performed on the semiconductor circuit pattern and an order of priority set with respect to the plural pairs of transistors so that the amount of pattern distortion with respect to one transistor forming the pair of transistors is equal to the amount of pattern distortion with respect to the other transistor forming the pair of transistors, the pattern correction adjusted based on the pair of transistors having highest priority.

15. A manufacturing method of an exposure mask comprising:

recognizing amounts of pattern distortion when a semiconductor circuit pattern having symmetrically arranged plural pairs of transistors as component elements is exposed and transferred onto a semiconductor substrate;

performing pattern correction on the semiconductor circuit pattern based on (i) an order of priority set with respect to the plural pairs of transistors and (ii) the recognized amounts of pattern distortion so that the amount of pattern distortion with respect to one transistor forming the pair of transistors is equal to the amount of pattern distortion with respect to the other transistor forming the pair of transistors, the pattern correction adjusted based on the pair of transistors having highest priority; and fabricating an exposure mask having a mask pattern corresponding to the semiconductor circuit pattern after the pattern correction.

16. A manufacturing method of a semiconductor device comprising:

recognizing amounts of pattern distortion when a semiconductor circuit pattern having symmetrically arranged plural pairs of transistors as component elements is exposed and transferred onto a semiconductor substrate;

performing pattern correction on the semiconductor circuit pattern based on (i) an order of priority set with respect to the plural pairs of transistors and (ii) the recognized amounts of pattern distortion so that the amount of pattern distortion with respect to one transistor forming the pair of transistors is equal to the amount of pattern distortion with respect to the other transistor forming the pair of transistors in the pattern correction, the pattern correction adjusted based on the pair of transistors having highest priority; and forming a transferred image onto a semiconductor substrate using an exposure mask having a mask pattern corresponding to the semiconductor circuit pattern after the pattern correction.

* * * * *